United States Patent
Matsumura et al.

(10) Patent No.: US 7,361,221 B2
(45) Date of Patent: *Apr. 22, 2008

(54) LIGHT IRRADIATION APPARATUS, CRYSTALLIZATION APPARATUS, CRYSTALLIZATION METHOD, SEMICONDUCTOR DEVICE AND LIGHT MODULATION ELEMENT

(75) Inventors: Masakiyo Matsumura, Yokohama (JP); Yukio Taniguchi, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 272 days.

This patent is subject to a terminal disclaimer.

(21) Appl. No.: 11/210,863

(22) Filed: Aug. 25, 2005

(65) Prior Publication Data

US 2006/0044565 A1   Mar. 2, 2006

(30) Foreign Application Priority Data

Sep. 2, 2004 (JP) ............................. 2004-255539
Mar. 24, 2005 (JP) ............................. 2005-085917

(51) Int. Cl.
*C30B 25/00* (2006.01)
(52) U.S. Cl. .................. 117/92; 117/201; 117/103; 257/72; 438/487
(58) Field of Classification Search .................. 117/1; 430/1; 250/1; 257/1; 438/1
See application file for complete search history.

(56) References Cited

U.S. PATENT DOCUMENTS

2004/0066569 A1 * 4/2004 Taniguchi .................. 359/883
2004/0214414 A1 * 10/2004 Matsumura et al. ........ 438/488

FOREIGN PATENT DOCUMENTS

JP   2004-31841   1/2004
JP   2004-72103   3/2004

OTHER PUBLICATIONS

U.S. Appl. No. 10/790,828, Matsumura et al., Mar. 3, 2004.*
U.S. Appl. No. 10/949,417, Taniguchi et al., Sep. 27, 2004.*
Masakiyo Matsumura, "Preparation of Ultra-Large Grain Silicon Thin-Films by Excimer-Laser", Surface Science, 2000, vol. 21, No. 5, pp. 278-287.
Masayuki Jyumonji, et al., "Arrays of Large Si Grains Grown at Room Temperature for x-Si TFTs", SID International Symposium Digest of Technical Papers, 2004, vol. XXXV, Book I, pp. 434-437.

* cited by examiner

*Primary Examiner*—Robert Kunemund
*Assistant Examiner*—Marissa W. Chaet
(74) *Attorney, Agent, or Firm*—Oblon, Spivak, McClelland, Maier & Neustadt, P.C.

(57) ABSTRACT

A light irradiation apparatus includes a light modulation element which has a phase modulation area having at least one basic pattern for modulating a light beam, an illumination system which illuminates the phase modulation area of the light modulation element with a light beam, and an image formation optical system which causes a light beam on an irradiation target surface a light intensity distribution having an inverse-peak-shaped pattern formed based on the light beam phase-modulated by the phase modulation element to fall on an irradiation target object. Dimensions of the basic pattern are not greater than a point spread function range of the image formation optical system converted in terms of the light modulation element. The phase modulation area is configured in such a manner that a phase distribution in a light complex amplitude distribution on the irradiation target surface becomes a saw-tooth-like distribution along a line segment in a lateral direction.

13 Claims, 20 Drawing Sheets

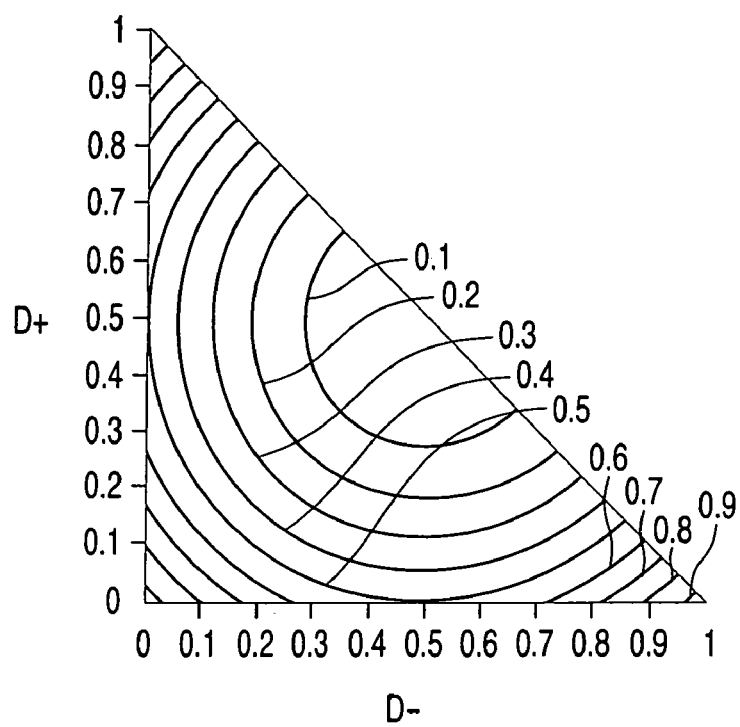
F I G. 4A
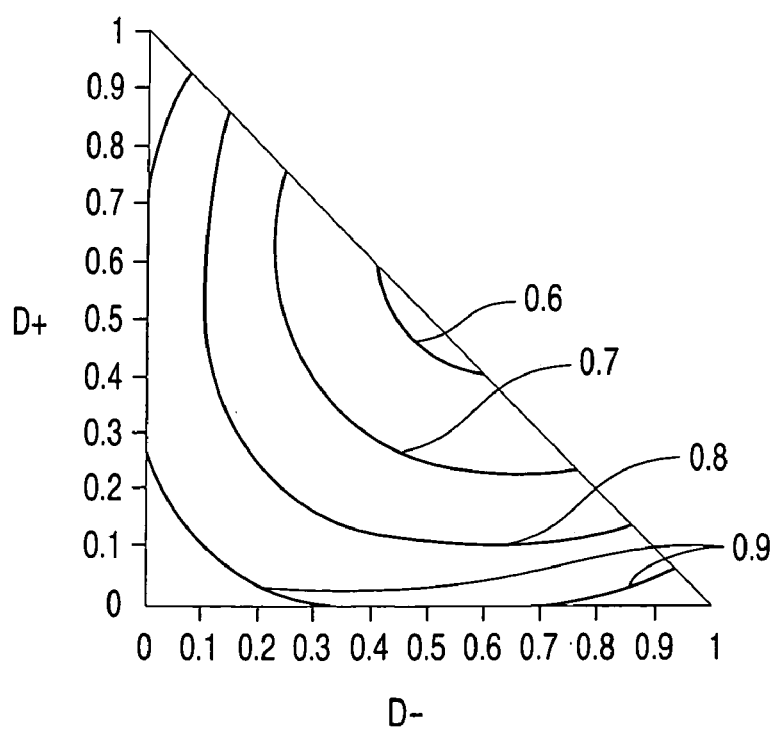
F I G. 4B

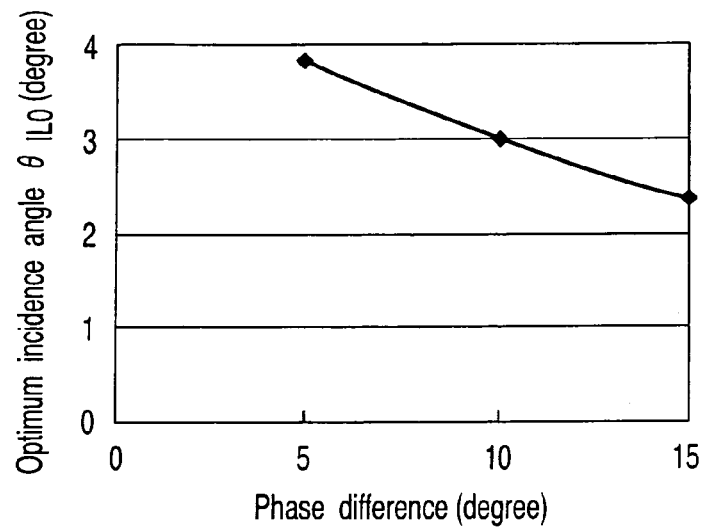
F I G. 14
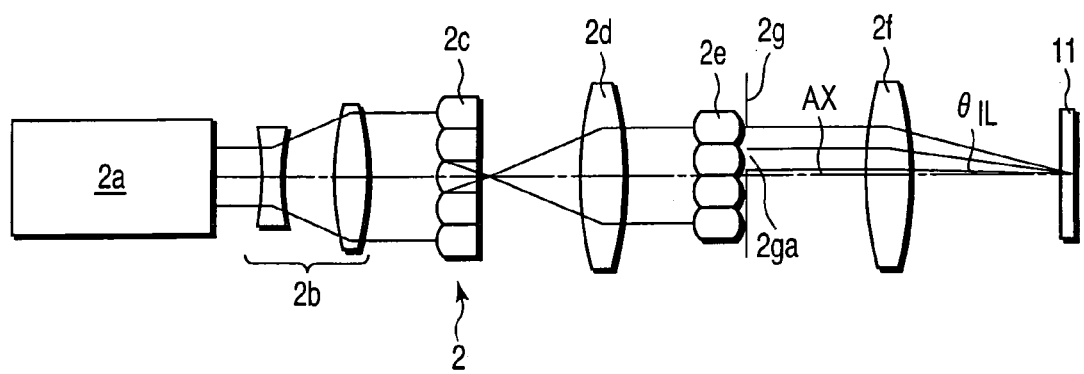
F I G. 15

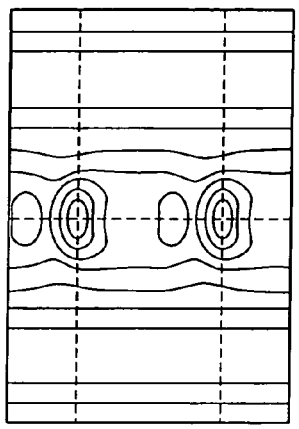 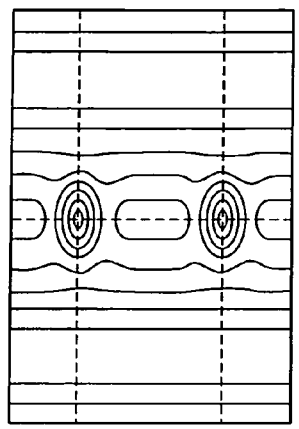 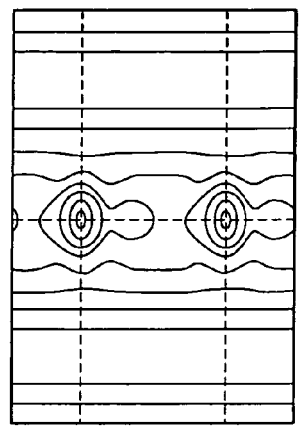
F I G. 21A     F I G. 21B     F I G. 21C
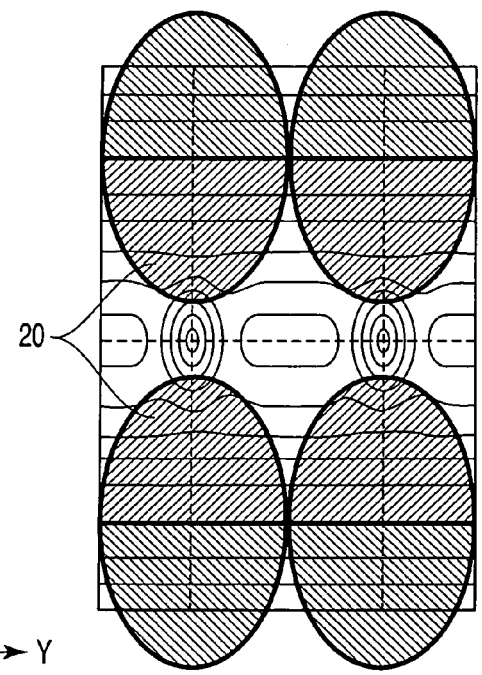
F I G. 22

US 7,361,221 B2

LIGHT IRRADIATION APPARATUS, CRYSTALLIZATION APPARATUS, CRYSTALLIZATION METHOD, SEMICONDUCTOR DEVICE AND LIGHT MODULATION ELEMENT

CROSS-REFERENCE TO RELATED APPLICATIONS

This application is based upon and claims the benefit of priority from prior Japanese Patent Applications No. 2004-255539, filed Sep. 2, 2004; and No. 2005-085917, filed Mar. 24, 2005, the entire contents of both of which are incorporated herein by reference.

BACKGROUND OF THE INVENTION

1. Field of the Invention

The present invention relates to a light irradiation apparatus, a crystallization apparatus, a crystallization method and a device, and relates to, e.g., a technique which generates a crystallized semiconductor film by irradiating a non-single-crystal semiconductor film with a laser beam having a predetermined light intensity distribution.

2. Description of the Related Art

A thin-film transistor (TFT) used for a switching element or the like which selects a display pixel in, e.g., a liquid crystal display (LCD) has been conventionally formed by using amorphous silicon or polysilicon.

Polysilicon has a higher mobility of electrons or holes than does amorphous silicon. Therefore, when a transistor is formed by using polysilicon, the switching speed and hence display response speed become higher than those in the case of forming the same by using amorphous silicon. Further, a peripheral LSI can comprise a thin-film transistor. Furthermore, there is an advantage of reducing the design margin of any other component. Moreover, when peripheral circuits such as a driver circuit or a DAC are incorporated in a display, these peripheral circuits can be operated at higher speed.

Since polysilicon comprises an aggregation of a plurality of crystal grains, when, e.g., a TFT transistor is formed, a crystal grain boundary or boundaries unfavorably present in a channel region, the crystal grain boundary serves as a barrier, and a mobility of electrons or holes is reduced as compared with that of single-crystal silicon. Additionally, each of many thin-film transistors formed by using polysilicon has a different number of crystal grain boundaries formed in a channel portion, and this difference becomes irregularities, resulting in a problem of unevenness in display in case of a liquid crystal display. Thus, there has been recently proposed a crystallization method which generates crystallized silicon with a large particle size enabling at least one channel region to be formed in order to improve the mobility of electrons or holes and reduce irregularities in number of crystal grain boundaries in a channel portion.

As this type of crystallization method, there has been conventionally known a phase-control excimer laser annealing (ELA) method which generates a crystallized semiconductor film by irradiating a non-single-crystal semiconductor film (a polycrystal semiconductor film or a non-single-crystal semiconductor film) with an excimer laser beam through a phase shifter approximated in parallel with the non-single-semiconductor film. Details of the phase-control ELA method are disclosed in, e.g., Journal of The Surface Science Society of Japan, Vol. 21, No. 5, pp. 278-287, 2000.

In the phase-control ELA method, a non-single-crystal semiconductor film is irradiated with a laser beam which has on an irradiation surface of the non-single-crystal semiconductor film a light intensity distribution having at least one inverse peak pattern (a pattern in which a light intensity is minimum at the center and the light intensity is suddenly increased toward the periphery) in which a light intensity at a point corresponding to a phase shift portion or line of a phase shifter is lower than that in the periphery. As a result, a temperature gradient is generated in a molten area in accordance with a light intensity distribution in an irradiation target area, a crystal nucleus or nuclei are formed at a part or parts which are solidified first or a part which is not melted in accordance with a point where the light intensity is minimum, and a crystal grows from the crystal nucleus in a lateral direction toward the periphery (which will be referred to as a "lateral growth" hereinafter), thereby generating a single-crystal grain with a large particle size.

Further, "Arrays of Large Si Grains Grown at Room Temperature for x-Si TFTs" by M. Jyumonji, et al., SID 04 Digest, pp. 434, 2004 discloses that positioning of a growth start point of a crystal is performed by irradiating a non-single-crystal semiconductor film with a light beam having a light intensity distribution with an inverse peak shape generated by a phase step of a phase shifter.

In the technique disclosed in this reference, a light intensity distribution with an inverse peak shape is formed by multiple phase steps obtained by dividing a phase of 360° into n steps. At this time, the phase difference per step is 360/n°. Furthermore, this reference describes that a light intensity at a bottom peak (an inverse peak point) in the light intensity distribution with the inverse peak shape can be adjusted by appropriately setting the number n of steps and appropriately setting the phase difference per step. In the multiple phase steps, the phase difference per step is decreased and the light intensity at the bottom peak becomes shallow (large) as the step number n is increased. Furthermore, the light intensity at the bottom peak can be adjusted to be close to a crystal growth start intensity by selecting a step having an appropriate phase difference.

FIGS. 24A to 24C are views illustrating simulation results of light intensity distributions obtained by a phase shifter 100 with two phase steps which has a phase area 100a of zero and a phase area 100b of 90°, a phase difference between these phase areas being 90°. When the two phase steps having the phase difference of 90° are used, a light intensity distribution with an inverse peak shape formed at a focus position of an image formation optical system is symmetrical with respect to each peak line 101 (a vertical line which is indicated by a broken line and runs through an inverse peak point of the light intensity distribution at the focus position) corresponding to each phase shift line 100c as shown in FIG. 24B. Conversely, as shown in FIGS. 24A and 24C, at defocus positions slightly shifted in the vertical direction from the focus position of the image formation optical system, the symmetry of the light intensity distribution with the inverse peak shape to be formed (the symmetry with respect to the peak line 101) largely collapses, and a position of each bottom beam is shifted (moved) in the lateral direction.

In general, when the two phase steps having a phase difference smaller than 180° is used, the symmetry of the light intensity distribution largely collapses at the defocus position distanced in the vertical direction from the focus position. Moreover, since the collapse of the symmetry is inverted depending on the defocus direction between the light intensity distribution shown in FIG. 24A and the light intensity distribution shown in FIG. 24C, a depth of focus becomes shallow (narrow). A shift direction of the bottom peak is on a phase advance side of the phase step (a portion depressed from the lower side in the figure) at the defocus position apart from the image formation optical system, and it is on a phase delay side of the phase step (a portion protruding toward the lower side in the figure) at the defocus position close to the image formation optical system. A board thickness deviation which can be a factor of defocus unavoidably exists in a processed substrate held at the focus position of the image formation optical system. That is, since there is a board thickness distribution on a given level on a glass substrate which is used for, e.g., a liquid crystal display, such defocus cannot be avoided.

The term "phase" pertaining to the present invention will be defined as follows, with reference to FIG. 26.

Consider the wavefront of an incident plane wave, which lies immediately behind a phase shifter. That part of the wavefront, which shifts in the propagation direction of light, is defined as "phase-advancing" side region. That part of the wavefront, which shifts toward the light source, is defined as "phase-delaying" side region. As FIG. 26 shows, the phase shifter has a protruding or thick part and a depressing or thin part on one surface. These parts border each other at a stepped portion. The protracting or projecting part is at the phase-advancing side region, and the depressing or receding part is at the phase-delaying side region.

This definition of phase can be applied also to other phase shifters that have neither a projecting part or a receding part. The phase may be controlled by using a fine pattern having lower resolution than the focusing optical system used. In this case, it suffices to apply the same definition of phase to the wavefront formed in the imaging field. For any phase shifter, the phase has a positive value if it advances. For example, +90° mans a phase advance, and −90° a phase delay.

Since a phase advance surface and a phase delay surface are alternately repeated in the two phase steps, the shift directions of the bottom peaks are alternately inverted. As a result, bottom peak positions are provided at irregular intervals, and hence crystal growth start positions (crystal grain positions) are also provided at irregular intervals, resulting in irregular shapes and sizes of crystal grains. Additionally, in general, of peaks provided on the both sides of the bottom peak, the light intensity of the peak on one side is raised and increased whilst the light intensity of the peak on the other side is lowered and decreased by defocus. As a result, the rising peak comes into contact with another rising peak, while the falling peak comes into contact with another falling peak, and a change in light intensity is amplified by the synergetic effect. This phenomenon becomes prominent as a pitch of the phase steps becomes small, and it is further emphasized when the light intensity distribution is converted into a temperature.

FIGS. 25A to 25C are views illustrating simulation results of light intensity distributions obtained by a phase shifter 110 with four phase steps whose phase difference is 90°. When the four phase steps with a phase difference of 90° is used, a light intensity distribution with an inverse peak shape formed at a focus position of the image formation optical system is symmetrical with respect to each peak line 101 (a vertical line which is indicated by a broken line and runs through an inverse peak point of the light intensity distribution at the focus position) corresponding to each phase shift line 110c as shown in FIG. 25B. Conversely, at a defocus position slightly shifted in the vertical direction from the focus position of the image formation optical system, as shown in FIGS. 25A and 25C, the symmetry of the light intensity distribution with the inverse peak shape to be formed greatly collapses, and a position of a bottom peak is shifted.

However, in general, in the case of the multiple phase step, since the phase advance directions are aligned in the same direction (a direction from the left side to the right side in the drawing) as different from the case of the two phase steps, the bottom peak shift directions are also aligned in the same direction (a direction from the right side to the left side in the drawing) (in this example, it is considered that a defocus quantity, i.e., a board thickness distribution of glass is locally fixed). Therefore, in the multiple phase step, the bottom peak positions are provided at equal intervals, and hence the crystal growth start positions (the crystal grain positions) are also provided at equal intervals, resulting in uniform shapes and sizes of crystal grains. Further, since the peak whose light intensity is raised and increased is in contact with the peak whose light intensity is lowered and decreased, a change in light intensity is offset (canceled out). Furthermore, considering that the light intensity distribution is converted into a temperature, changes in light intensity can be further homogenized.

As described above, although the multiple phase steps are advantageous as compared with the two phase steps, but there are the following problems. Firstly, in case of the multiple phase steps, a phase step having a phase difference of 360/n° alone can be realized. Specifically, in case of four phase steps shown in FIG. 25A, when an attempt is made to equalize phase differences of all the steps, a phase difference when returning to the zero-order step from the third step must be equal to the phase difference between other steps. Considering this restriction, 360/n° is the only phase difference in the multiple phase steps. Therefore, even though a phase difference between discrete phase differences (angles) determined as 360/n° under various conditions is optimum, this phase difference cannot be realized.

Secondly, in the case of multiple phase steps, a light modulation element (a phase shifter) is hard to be manufactured. That is, although manufacture of a phase step is generally realized by repeating irregular processing with a fixed depth more than once, the phase steps can be realized by performing processing for m times until the step number reaches $2^m$. Specifically, four ($4=2^2$) phase steps can be realized by performing processing for two times and five to eight ($8=2^3$) phase steps can be realized by performing processing for three times. In this manner, irregular processing for three times or more is necessary in order to realize five or more phase steps. Considering the difficulty in reprocessing over the once processed irregular surface and the difficulty in alignment (positioning), four or fewer phase steps which require irregular processing for two times can be realized, but it is very difficult to produce multiple phase steps which require irregular processing for three times or more. Even though, e.g., approximately six phase steps are desirable in order to set a light intensity distribution of the bottom peak to an appropriate intensity, the realization is difficult since irregular processing must be carried out for three times.

BRIEF SUMMARY OF THE INVENTION

It is an object of the present invention to provide a technique which can stably form a light intensity distribution with an inverse peak shape which has a desired bottom peak light intensity at a desired position and form crystal grains with equal shapes and sizes to a semiconductor film.

According to a first aspect of the present invention, there is provided a light irradiation apparatus comprising: a light modulation element which has at least one unit phase modulation area having at least one basic pattern for modulating a light beam; an illumination system which illuminates the unit phase modulation area of the light modulation element with a light beam; and an image formation optical system which causes a light beam having on an irradiation target surface a light intensity distribution having an inverse-peak-shaped pattern formed based on the light beam phase-modulated by the phase modulation element to fall on an irradiation target object, wherein dimensions of the basic pattern of the unit phase modulation area are not greater than a point spread function range of the image formation optical system converted in terms of the light modulation element, and the unit phase modulation area is configured in such a manner that a phase distribution in a light complex amplitude distribution on the irradiation target surface becomes a saw-tooth-like distribution along a line segment in a lateral direction.

According to a preferred mode of the first aspect, the phase modulation area is configured in such a manner that an amplitude distribution along the predetermined line segment in the light complex amplitude distribution becomes substantially constant except for an area corresponding to a step portion of a saw-tooth-like distribution in the phase distribution. Furthermore, it is preferable that the phase modulation area is configured in such manner that an amplitude distribution in the light complex amplitude distribution increases in accordance with a distance from the predetermined line segment.

Moreover, according to the preferred mode of the first aspect, the phase modulation area comprises areas having at least three types of phase modulation values. Additionally, it is preferable for the illumination system to illuminate the light modulation element with an illumination light beam which is inclined along the inside of a surface including the predetermined line segment. In this case, it is preferable for the illumination system to illuminate the light modulation element along a direction (a lateral direction) corresponding to a direction including a component directed from a phase advance side to a phase delay side at the step portion of the saw-tooth-like distribution in the phase distribution.

According to a second aspect of the present invention, there is provided a crystallization apparatus comprising: the light irradiation apparatus according to the first aspect; and a stage which holds a non-single-crystal semiconductor film on the irradiation target surface, wherein the crystallization apparatus generates a crystallized semiconductor film by irradiating a non-single-crystal semiconductor film held on the predetermined surface with a light beam having the predetermined light intensity distribution.

According to a third aspect of the present invention, there is provided a crystallization method which uses the light irradiation apparatus according to the first aspect and generates a crystallized semiconductor film by irradiating a non-single-crystal semiconductor film held on the irradiation target surface with a light beam having the light intensity distribution.

According to a fourth aspect of the present invention, there is provided a semiconductor device manufactured by using the crystallization apparatus according to the second aspect or the crystallization method according to the third aspect.

According to a fifth aspect of the present invention, there is provided a light modulation element having at least one phase modulation area, wherein the phase modulation area is configured in such a manner that a phase distribution in a light complex amplitude distribution formed on a surface which is optically substantially conjugate with the light modulation light becomes a saw-tooth-like distribution along a line segment in a lateral direction.

According to a preferred mode of the fifth aspect, the phase modulation area is configured in such a manner that an amplitude distribution along the line segment in the light complex amplitude distribution becomes substantially constant except for an area corresponding to a step portion of a saw-tooth-like distribution in the phase distribution. Additionally, it is preferable that the phase modulation area is configured in such a manner that the amplitude distribution in the light complex amplitude distribution increases in accordance with a distance from the predetermined line segment. Further, it is preferable for the phase modulation area to comprise areas having at least three types of phase modulation values.

In the present invention, the amplitude distribution and the phase distribution on an image formation surface can be independently controlled by using the light modulation element based on so-called "three-value phase modulation". As a result, in the crystallization apparatus and the crystallization method according to the present invention, by using the light modulation element of the three-value phase modulation, the light intensity distribution with an inverse peak shape which has a desired bottom peak light intensity can be stably formed at a desired position and hence crystal grains having equal shapes and sizes can be formed to a semiconductor film.

BRIEF DESCRIPTION OF THE SEVERAL VIEWS OF THE DRAWING

FIGS. 4A and 4B are views showing calculation results of a light intensity I when phase angles θ are 90° and 40°, respectively;

FIGS. 9A and 9B are views showing an example where corresponding points a to e are plotted in the diagram on the assumption that one repeat unit is constituted by using five cells, in which FIG. 9A shows a light intensity and FIG. 9B shows a phase;

FIG. 14 is a view showing a relationship between a phase difference (degrees) between the phase steps and an optimum incidence angle $\theta_{ILO}$ (degrees) of the illumination light in oblique illumination;

FIG. 15 is a view schematically showing a modification of oblique illumination;

FIGS. 21A to 21C are views showing light intensity distributions obtained by oblique illumination using the light modulation element according to the second embodiment;

FIG. 22 is a view schematically showing crystal grains having a large particle size formed in the second embodiment;

DETAILED DESCRIPTION OF THE INVENTION

Figure 1:
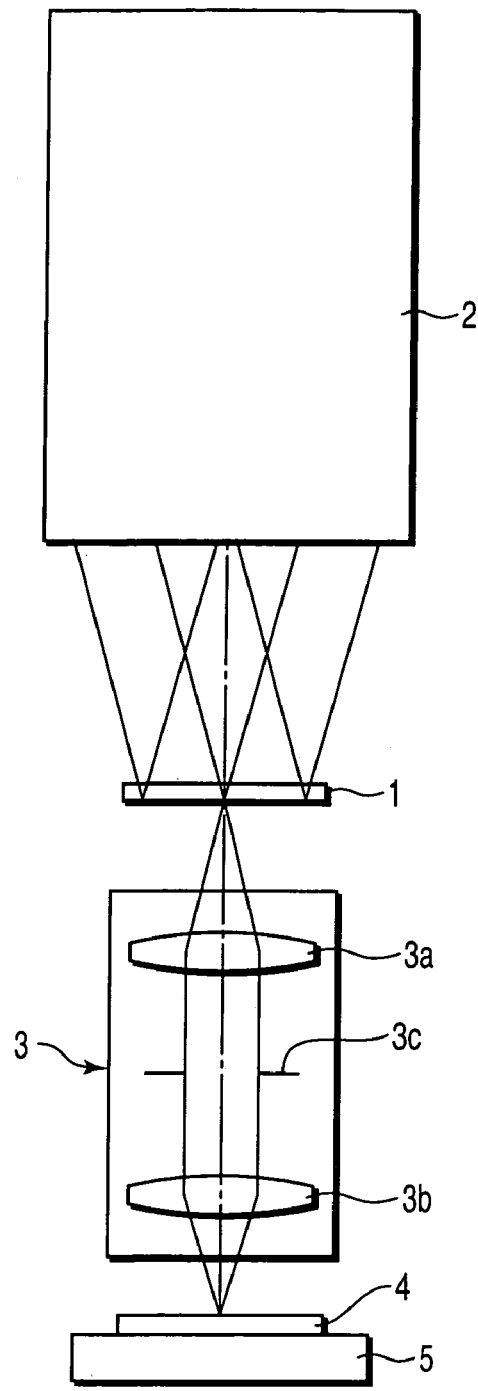
FIG. 1 is a view schematically showing a configuration of a crystallization apparatus according to an embodiment of the present invention.
Figure 2:
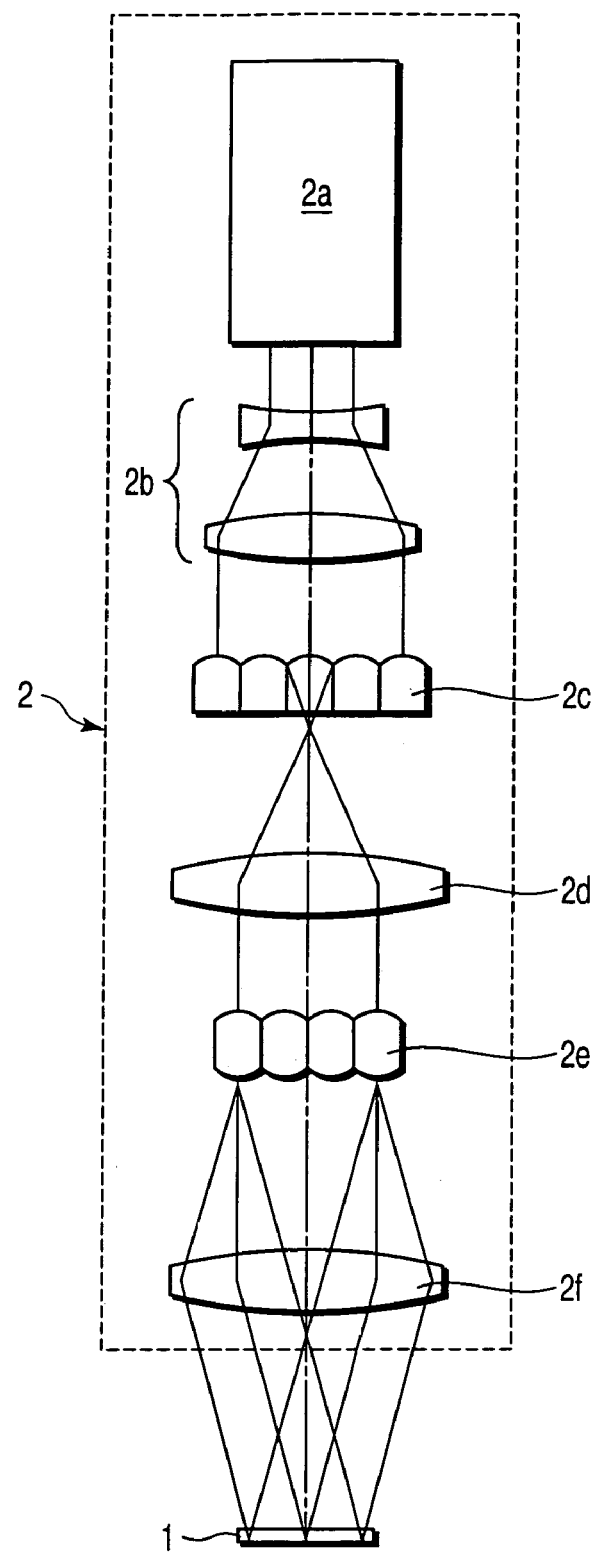
FIG. 2 is a view schematically showing an internal configuration of an illumination system depicted in FIG. 1.

Embodiments according to the present invention will now be described with reference to the accompanying drawings. FIG. 1 is a view schematically showing a configuration of a crystallization apparatus according to an embodiment of the present invention. FIG. 2 is a view schematically showing an internal configuration of an illumination system. Referring to FIGS. 1 and 2, a crystallization apparatus according to this embodiment includes a light modulation element 1 like a phase shifter which forms a light beam having a predetermined light intensity distribution by modulating a phase of an incident light beam, an illumination system 2 which illuminates the light modulation element 1, an image formation optical system 3, and a substrate stage 5 which supports a processed substrate 4.

A configuration and effect of the light modulation element 1 will be described later. The illumination system 2 comprises a KrF excimer laser beam source 2a which emits a laser beam having a wavelength of, e.g., 248 nm. As the light source 2a, it is possible to use any other appropriate light source like an XeCl excimer laser beam source or a YAG laser beam source having a performance which projects an energy beam ray which melts a crystallization processing target substance. Laser beam projected from the light source 2a is expanded through a beam expander 2b and then enters a first fly-eye lens 2c.

In this manner, a plurality of small light sources are formed on a rear focal surface of the first fly-eye lens 2c, and an incidence surface of a second fly-eye lens 2e is illuminated with light small beams or beamlets (flux) from the plurality of small light sources in an overlapping manner through a first condenser optical system or lens 2d. As a result, more small light sources are formed on a rear focal surface of the second fly-eye lens 2e than those on the rear focal surface of the first fly-eye lens 2c. The light modulation element 1 is illuminated with small light beams as beamlets from the plurality of small light sources formed on the rear focal surface of the second fly-eye lens 2e in an overlapping manner through a second condenser optical system or lens 2f.

The first fly-eye lens 2c and the first condenser lens 2d constitute a first homogenizer. The first homogenizer homogenizes a laser beam projected from the light source 2a in relation to an incidence angle on the light modulation element 1. The second fly-eye lens 2e and the second condenser lens 2f constitute a second homogenizer. The second homogenizer homogenizes the laser beam having the homogenized incidence angel from the first homogenizer in relation to a light intensity at each in-plane position on the light modulation element 1.

In this manner, the light modulation element 1 is irradiated with the laser beam having a substantially homogenous light intensity distribution by the illumination system 2. The laser beam subjected to optical modulation, e.g., phase modulation by the light modulation element 1 is incident onto a processed substrate 4 through the image formation optical system 3. Here, the image formation optical system 3 arranges a phase pattern surface of the light modulation element 1 and the processed substrate 4 in an optically conjugate relationship. In other words, the processed substrate 4 (more precisely, an irradiation target surface of this processed substrate 4) is set to a surface (an image surface of the image formation optical system 3) which is optically conjugate with the phase pattern surface of the light modulation element 1.

The image formation optical system 3 comprises a first positive lens assembly 3a, a second positive lens assembly 3b and an aperture diaphragm 3c arranged between these lens assemblies. A size of an aperture portion (a light transmission portion) of the aperture diaphragm 3c is set (and hence an image side numeral aperture NA of the image formation optical system 3) in such a manner that a necessary light intensity distribution is generated on a semiconductor film (the irradiation target surface) of the processed substrate 4. The image formation optical system 3 may be a refraction type optical system, may be a reflection type optical system, or may be a refraction/reflection type optical system.

The processed substrate 4 is configured by forming a lower layer insulating film, a semiconductor thin film and an upper layer insulating film on a substrate in the mentioned order. More precisely, in this embodiment, the processed substrate 4 is obtained by sequentially forming an underlying insulating film, a non-single-crystal semiconductor film, e.g., an amorphous silicon film and a cap film, on, e.g., liquid crystal display sheet glass, by chemical vapor deposition (CVD). Each of the underlying insulating film and the cap film is an insulating film made of, e.g., $SiO_2$. The underlying insulating film avoids diffusing of foreign particles such as Na in the glass substrate into the amorphous silicon film caused due to direct contact between the amorphous silicon film and the glass substrate, and also prevents heat of the amorphous silicon film from being directly transmitted to the glass substrate.

The amorphous silicon film is a semiconductor film to be crystallized. The cap film is heated by a part of a light beam which enters the amorphous silicon film, and stores a temperature when heated. Although the temperature of a high-temperature region in the irradiation target surface of the amorphous silicon film is rapidly reduced when incidence of a light beam is interrupted, this thermal storage effect alleviates this temperature drop gradient and facilitates the crystal growth with a large particle size in the lateral direction. The processed substrate 4 is positioned and held at a predetermined position on the substrate stage 5 by a vacuum chuck, an electrostatic chuck or the like.

Prior to a concrete description of the light modulation element 1, a principle of the present invention will be explained hereinafter. In the present invention, it has been discovered that an amplitude distribution and a phase distribution on an image formation surface can be independently controlled by using a light modulation element (a phase modulation element) having three (three or more in general) phase modulations, i.e., three-value phase modulation. Further, it has been found out that effects equivalent to those of multiple phase steps can be realized by generating a distribution in which an amplitude is fixed but a phase varies in a saw-tooth-like form (a state in which substantially triangular teeth each of which has two sides with different lengths defining an apex angle are aligned in the lateral direction). The principle of three-value phase modulation will now be described hereinafter.

Figure 3A:
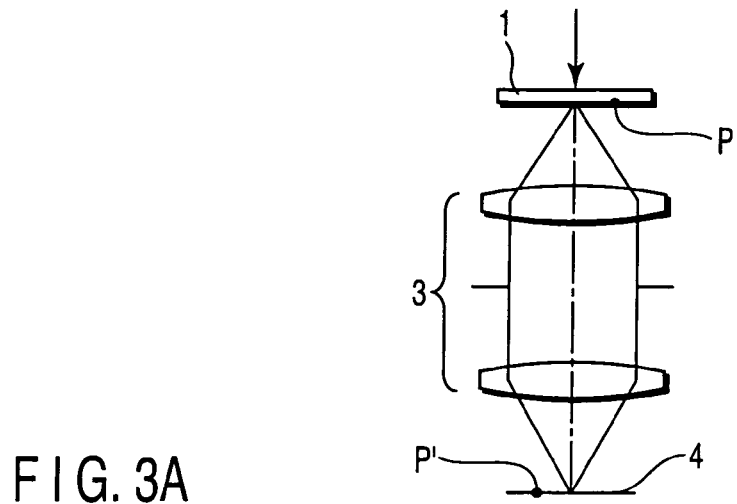
FIGS. 3A to 3C are views illustrating that an amplitude and a phase can be independently controlled by using three phase modulation values.
Figure 3B:
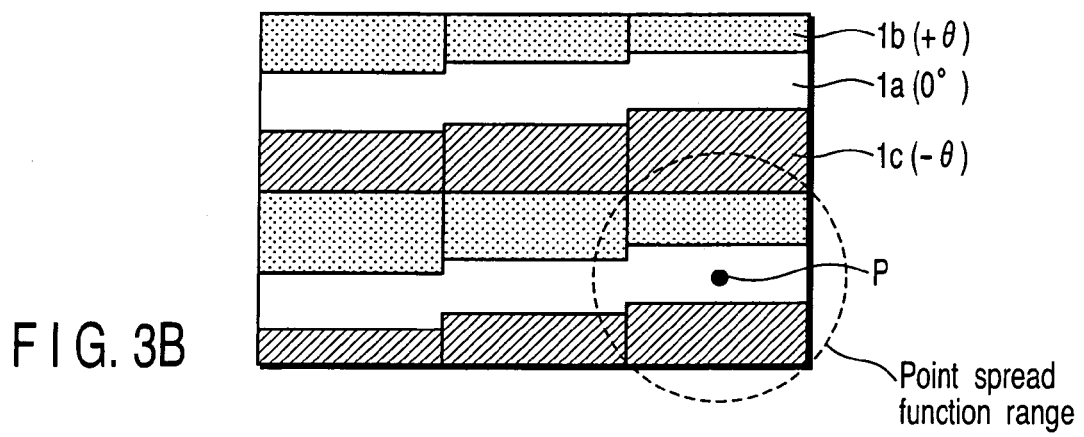
Figure 3C:
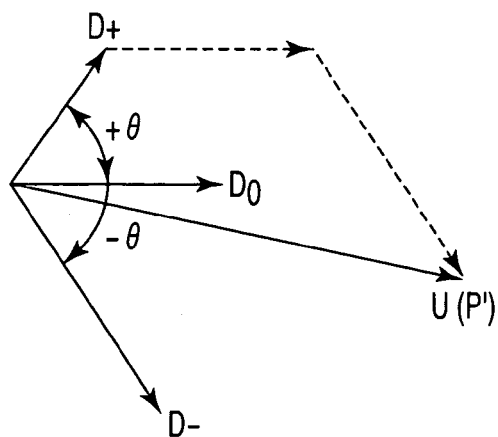

A description will be first given as to the fact that an amplitude and a phase of a laser beam with respect to an image formation surface can be independently controlled by using three phase modulation values with reference to FIGS. 3A to 3C. A light emitted from a point P on the light modulation element 1 reaches a point P' on the processed substrate 4 through the image formation optical system 3 as shown in FIG. 3A. As shown in FIG. 3B, the light modulation element 1 comprises a transparent substrate like a quartz substrate in which a plurality of cells (a basic pattern) are formed in a matrix shape on one surface in the lengthwise direction and the lateral direction, the cell comprising three areas 1a to 1c having three types of phase modulation values, i.e., the first area 1a having a phase modulation value of zero which becomes a reference, the second area 1b having a phase modulation value of +θ (the relative phase difference when the phase modulation quantity in the reference phase area 1a is normalized as zero) and the third area 1c having a phase modulation value of −θ.

In this example, paying attention to the point P' on the processed substrate 4 corresponding to the point P on the light modulation element 1, a light complex amplitude distribution U (P') at the point P' can be obtained by a convolution (approximation in the coherent image formation theory) of a point spread function amplitude distribution PSF(x, y) determined by the image formation optical system 3 and an amplitude transmittance distribution T(x, y) of the light modulation element 1 as shown in the following Expression (1). Here, (x, y) is a coordinate on the light modulation element 1.

$$U(P')=PSF(x, y)*T(x,y) \tag{1}$$

The point spread function amplitude distribution PSF(x, y) is discontinued at a point 0 closest to an origin (the center of the distribution), approximation is performed on the assumption that a value is fixed in this range, and this range is referred to as a "point spread function range". Also, an imaginary circle that is formed as point 0 closest to the origin moves one time around the vertical axis passing the origin and representing the amplitude is called "Airy Disc." Here, since an amplitude of the amplitude transmittance distribution T(x, y) is constant, the right side of Expression (1) is represented as a sum of vectors having lengths which are in proportion to area ratios of the phase modulation areas (area ratios of the area 1a, area 1b and area 1c of the cell (the basic pattern) having the point P) in the point spread function range. In general, assuming that NA is the numeral aperture of an incidence side of the image formation optical system 3 and λ is the wavelength of the light, the point spread function range is represented by a circle having a radius of 0.61λ/NA on the image surface (indicated by a broken line in FIG. 3B).

The basic pattern of the phase modulation areas in the light modulation element 1 has the first to third areas 1a to 1c having three different phase modulation values as described above. Furthermore, as shown in FIG. 3B, the area of the basic pattern of the phase modulation areas has a size which is not greater than the point spread function range converted in terms of the light modulation element 1. In each basic pattern, it is assumed that $D_0$ is a "duty" which is an area ratio ($S_{1a}/S$) of a superficial content ($S_{1a}$) of the first area 1a having a phase modulation value of zero with respect to a superficial content (S) of each basic pattern, $D_+$ is a duty which is an area ratio ($S_{1b}/S$) of a superficial content ($S_{1b}$) of the second area 1b having a phase modulation value of +θ and $D_-$ is a duty which is an area ratio ($S_{1c}/S$) of an area ($S_{1c}$) of the third area 1c having a phase modulation value of −θ.

Provided that a change in duty is gentle in the surface (a change between adjacent cells is small), the area ratios of the phase modulation areas in the point spread function range substantially match with the duties $D_+$, $D_-$ and $D_0$. Therefore, the light complex amplitude distribution U(P') at the point P' can be represented by FIG. 3C. That is, since $D_+ + D_0 + D_- = 1$, the light complex amplitude distribution U(P') is determined based on the duties $D_+$ and $D_-$ and the phase angle θ, and an amplitude AMP, a light intensity I and a phase φ can be respectively determined based on the following Expressions (2) to (4).

$$AMP=(X^2+Y^2)^{1/2} \tag{2}$$

$$I=X^2+Y^2 \tag{3}$$

$$\phi=\tan^{-1}(Y/X) \tag{4}$$

where $X=(D_+ + D_-)\cos\theta + D_0$ $Y=(D_+ - D_-)\sin\theta$ (X, Y) in Expressions (2) to (4) is a component of a synthetic vector U(P') in FIG. 3C. In general, assuming that (x, y) is a coordinate on the light modulation element 1, an amplitude AMP(x, y) and a phase φ (x, y) of a laser beam on the image formation surface can be represented by the following Expressions (5) and (6). In Expressions (5) and (6), amp{ } is a function which provides an amplitude of a complex number, arg{ } is a function which provides an angle of the complex number, θ(x, y) is a phase modulation distribution on the light modulation element 1, and s is a circle having a predetermined radius with (x, y) being set at the center.

$$|AMP(x, y)|^2 = \text{amp}\left\{\int_S e^{i\theta(x,y)} dx dy\right\} \quad (5)$$

$$\phi(x, y) = \arg\left\{\int_S e^{i\theta(x,y)} dx dy\right\} \quad (6)$$

Figure 5A:
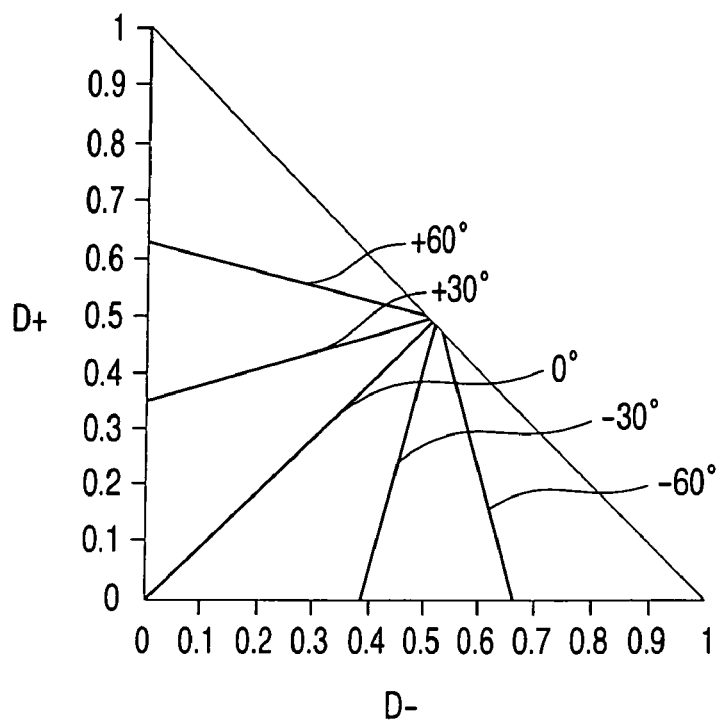
FIGS. 5A and 5B are views showing calculation results of a phase φ when phase angles φ are 90° and 40°, respectively.
Figure 5B:
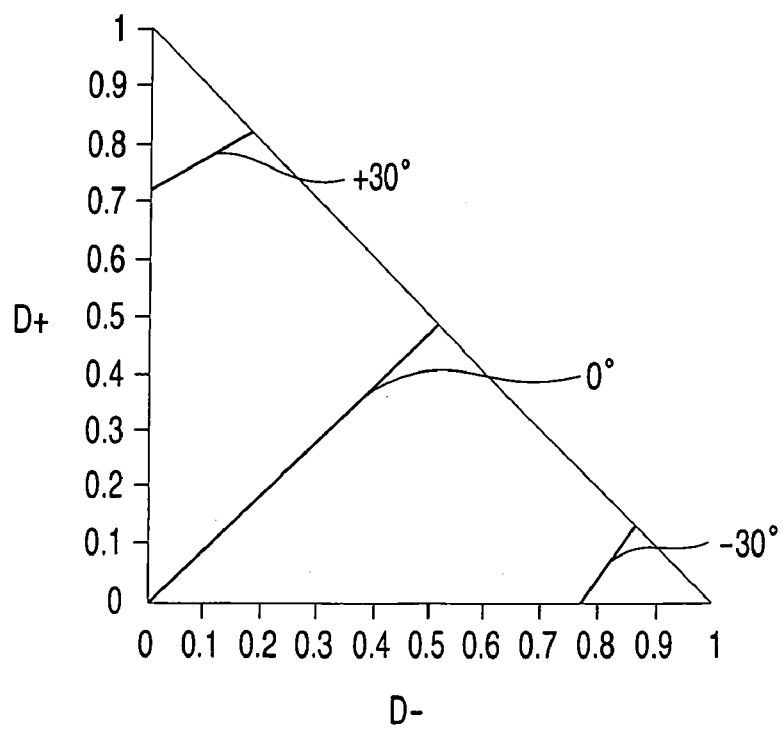

A calculation result of the light intensity I is shown in FIGS. 4A and 4B, and a calculation result of the phase φ is shown in FIGS. 5A and 5B. In these figures, a horizontal axis represents the duty $D_-$, a vertical axis represents the duty $D_+$, and a line of a fixed light intensity I ($=|U|^2$) and a line of a fixed phase φ are represented by contour lines. FIGS. 4A and 5A show calculation results when the phase angle θ is 90°, and FIGS. 4B and 5B show calculation results when the phase angle θ is 40°.

Figure 6:
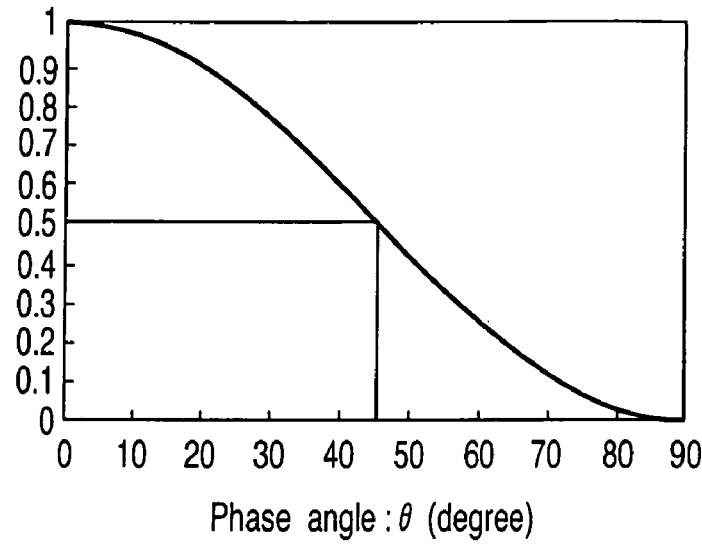
FIG. 6 is a view showing a relationship between the phase angle θ and a minimum value of the light intensity I.

By using such diagrams as shown in FIGS. 4A to 5B, a relationship between the duty, the light intensity I and the phase φ calculated from Expressions 5 and 6 can be readily obtained. When the phase angle θ is selected from a range of 0 to 90°, a relationship between the duty and the light intensity I monotonously changes, and it can be easily used. Under this condition, the light intensity I takes a maximum value 1 when a set of duties ($D_+$, $D_-$) is (0, 0), (1, 0) and (0, 1), the light intensity I is reduced as this set approximates a point (0.5, 0.5), and the light intensity I takes a minimum value $I_{min}$ at the point (0.5, 0.5). As shown in FIG. 6, the minimum value $I_{min}$ of the light intensity I can be provided by $I_{min}=\cos^2\theta$ based on a simple calculation (Expressions (3) and (4)) as shown in FIG. 6.

Therefore, it is good enough to determine the phase angle θ in accordance with the light intensity distribution which should be realized on the processed substrate 4. For example, in cases where a light intensity distribution in which a light intensity when the maximum value is standardized as 1 varies in a range of 0.5 to 1.0 is desired to be realized, since the minimum value Imin=0.5 of the light intensity I is provided when the phase angle θ=45°, selecting the phase angle θ from the range of 45 to 90° can suffice. In this case, when the phase angle θ is set to 45°, the duty $D_0$ becomes close to zero in the vicinity of the minimum value $I_{min}$ of the light intensity, a size of the area 1a having the phase modulation value of zero becomes too small, and hence manufacture is difficult. Therefore, it is desirable to add an appropriate value to the phase angle (45° in this case) which provides a desired minimum value $I_{min}$ of the light intensity I.

Then, a diagram with respect to the above-described phase angle θ is created based on the determined phase angle θ. Furthermore, a set of the duties ($D_+$, $D_-$) is obtained from this diagram based on the distribution of the light intensity I and the distribution of the phase φ which should be realized on the processed substrate 4, and the obtained set of the duties ($D_+$, $D_-$) is assigned to a corresponding point of the light modulation element 1. Thereafter, it is good enough to determine the areas 1a to 1c having the respective phase modulation values (a superficial content (an area), a shape and a position of each area) from the assigned set of the duties ($D_+$, $D_-$). In this example, a shape of the basic pattern of the phase modulation areas is arbitrary as long as its size is not greater than the point spread function range converted in terms of the light modulation element.

Figure 7:
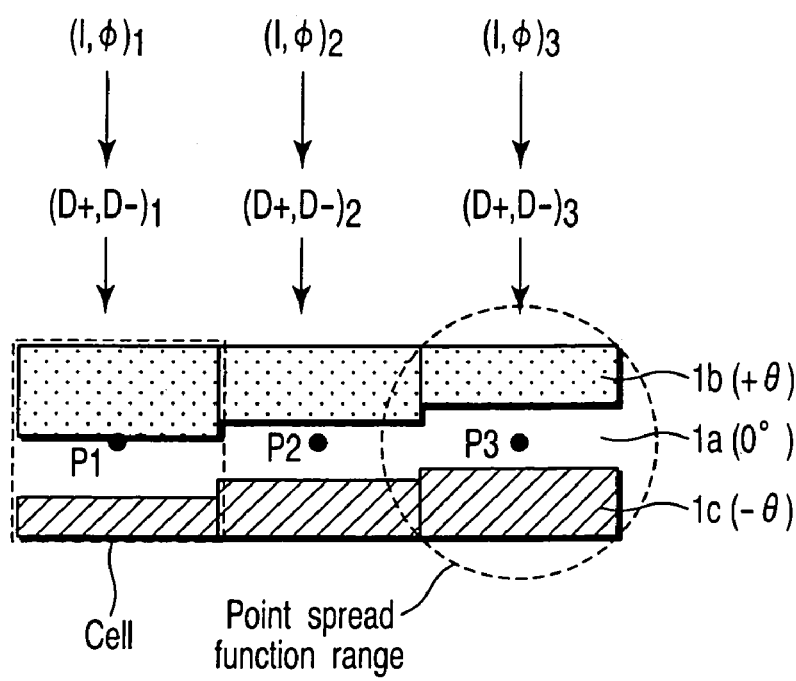
FIG. 7 is a view illustrating a procedure of determining a configuration of each basic pattern of a phase modulation area.

The above-described procedure will now be explained in more detail. The basic procedure will be first described with reference to FIG. 7. Firstly, a space is divided into a plurality of square cells (the basic pattern) having a dimension which is not greater than the point spread function range. Then, typical points P1, P2 and P3 are respectively provided at the centers of the cells. Moreover, the set of duties ($D_+$, $D_-$) is assigned from the diagrams (shown in FIGS. 4A to 5B) in accordance with a value of a set (I, φ) of the light intensity I and the phase φ. At last, the first to third areas 1a to 1c having the respective phase modulation values are arranged in the cell in accordance with a value of the set of duties ($D_+$, $D_-$). In the example of FIG. 7, the second area 1b having the phase modulation value of +θ is arranged on the upper side of the cell, the third area 1c having the phase modulation value of −θ is arranged on the lower side of the same, and the first area 1a having the phase modulation value of zero is arranged between these areas.

Figure 8A:
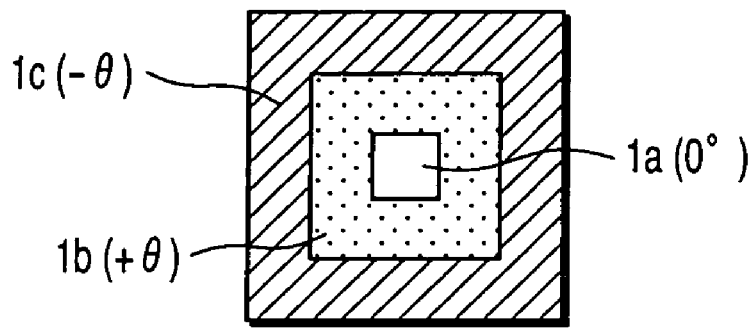
FIGS. 8A and 8B are views illustrating another procedure of determining a configuration of each basic pattern of a phase modulation area.
Figure 8B:
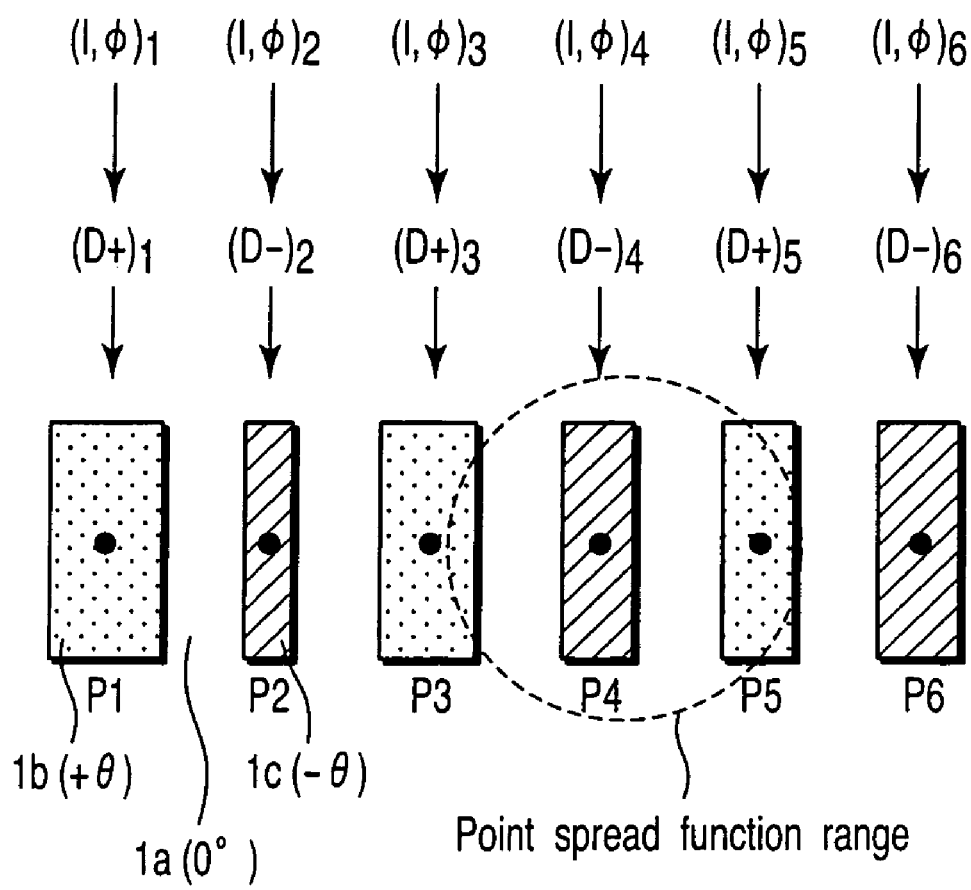

Although the areas 1a to 1c having the three modulation phase values are assigned in each cell in the procedure shown in FIG. 7, a gravity point of the area having at least one phase modulation value deviates from the typical point unless such a concentric arrangement as shown in FIG. 8 is adopted. Additionally, such a concentric arrangement shown in FIG. 8A is hard to be created since a width of the outermost area (the area 1c in this case) becomes narrow. In order to eliminate this inconvenience, a procedure shown in FIG. 8B is also possible.

In the procedure shown in FIG. 8B, typical points P1 to P6 are provided at intervals each of which is not more than half of a radius of the point spread function range. Then, a set (I, φ) of the light intensity I and the phase φ is specified with respect to each of the typical points P1 to P6. Then, one in the duty set ($D_+$, $D_-$) is alternately assigned from the diagram in accordance with a vale of the set (I, φ) of the light intensity I and the phase φ. At last, the area 1b or 1c having a phase modulation value corresponding to the duty $D_+$ or $D_-$ is arranged with the typical points P1 to P6 at the center. Any other area automatically becomes the area 1a having the phase modulation value of zero.

Figure 9A:
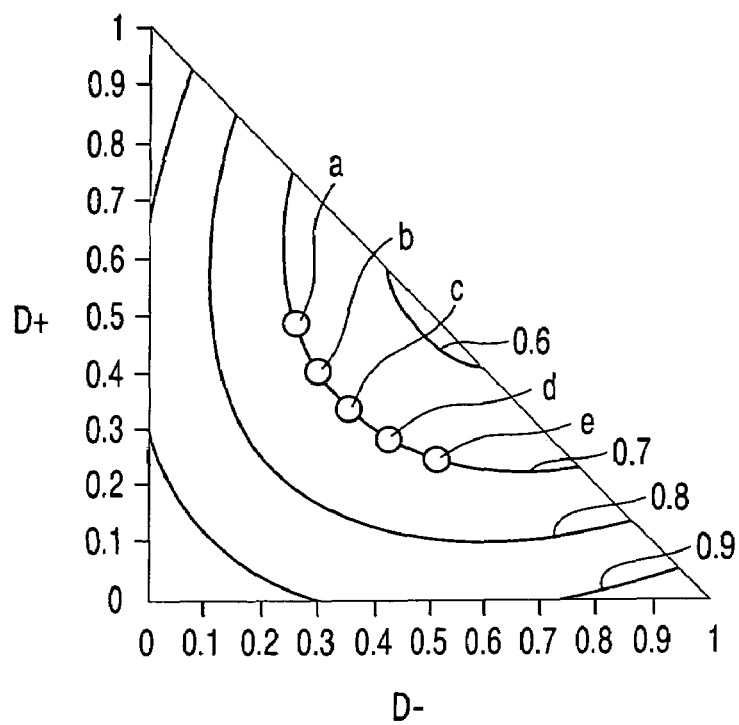
Figure 9B:
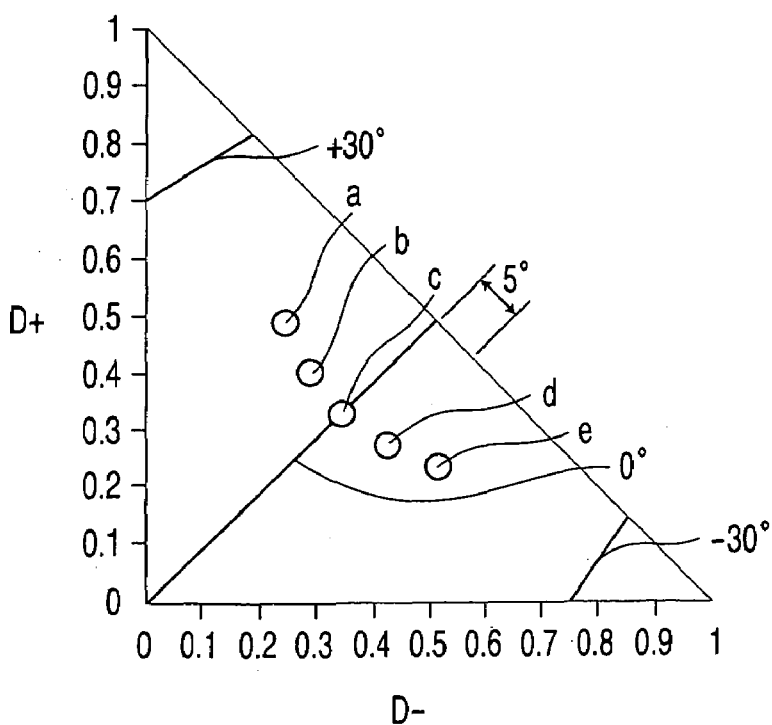

A description will now be given as to a method of generating a distribution in which the amplitude is constant and the phase φ varies in the saw-tooth-like form. FIGS. 9A and 9B show examples when corresponding points a to e are plotted in the diagram on the assumption that one repeat unit is constituted of five cells. That is, the points a to e are distributed so that the light intensity I becomes parallel to a contour line of a predetermined intensity (the light intensity 0.7 in this case) in FIG. 9A showing a calculation result of the light intensity I, and these points are distributed so that the phase φ has an equal angular interval (the angular interval of 5° in this case) in FIG. 9B showing a calculation result of the phase φ.

Figure 10A:
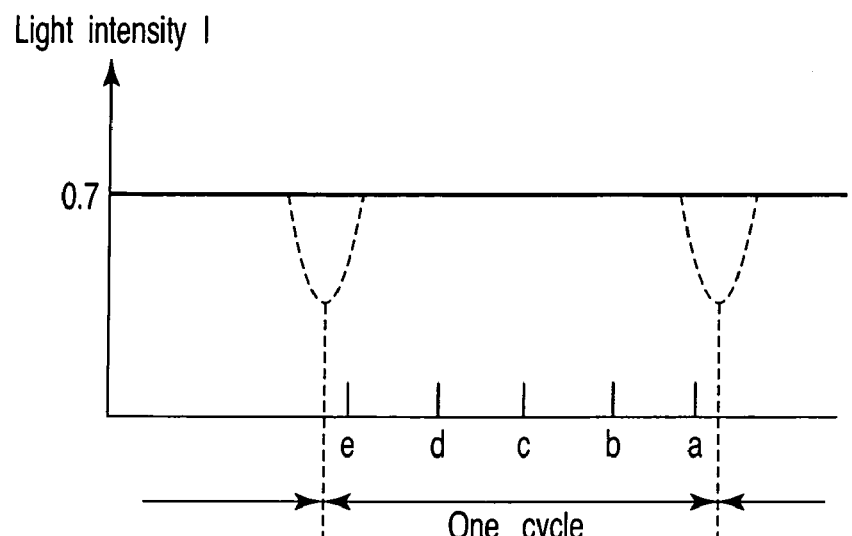
FIGS. 10A and 10B are views showing a distribution of the light intensity I and a distribution of the phase φ which are expected to be obtained in accordance with the example depicted in FIGS. 9A and 9B.
Figure 10B:
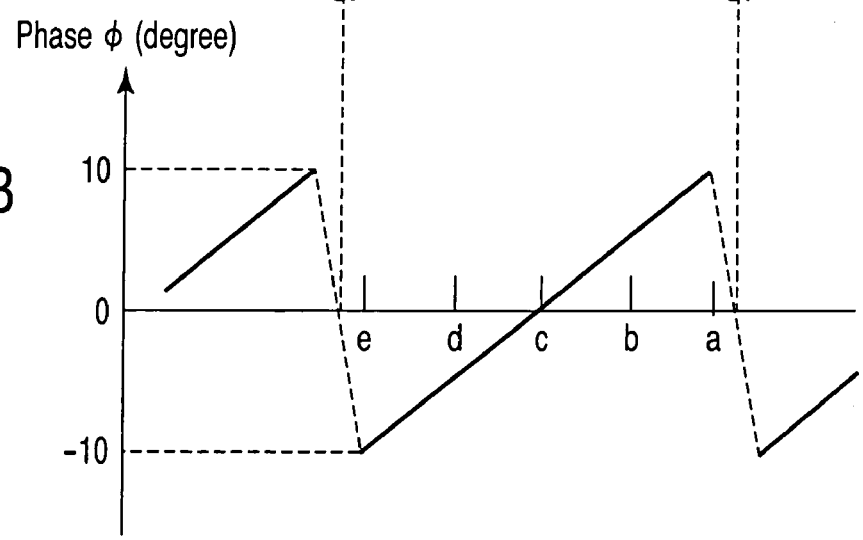

FIGS. 10A and 10B show the light intensity I and the phase φ which are expected to be obtained in accordance with the configurations of FIGS. 9A and 9B. The light intensity I basically maintains the constant light intensity 0.7 as shown in FIG. 10A, and the phase φ varies in the saw-tooth-like form between +10° and −10° as shown in FIG. 10B. Further, the light intensity I is reduced due to interference at a step part of the saw teeth of the phase φ (each part indicated by a broken line in the figure) and a light intensity distribution with an inverse peak shape (indicated by a broken line in the figure) is generated. Although this is seemingly inconsistent with the constancy of the light intensity, the above-described diagram is achieved on the assumption that a change in duty is gentle, and the above-described fact is consistent since this assumption is not attained at the step part of the saw teeth of the phase φ. Acquisition of the light intensity distribution as expected will be confirmed in a later-described embodiment.

As mentioned above, a light intensity distribution with an inverse peak shape is generated at the step part of the saw teeth of the phase φ in the three-value phase modulation. The technique using the three-value phase modulation has the following characteristics. At first, since directions of changes in phase are made uniform in the same direction, in-plane shifts due to defocusing at a bottom peak in the light intensity distribution with the inverse peak shape are also made uniform in the same direction. At second, since it is good enough to form areas having three types of phase modulation values, performing irregular processing twice can suffice. At third, a phase difference of the phase steps can be arbitrarily set (not discretely like multiple phase steps). Although the saw-tooth-like steps of the phase φ may be produced in such a manner that the surface of the substrate has a geometrically saw-tooth-like form in principle, this production is very difficult by a regular lithography method, and hence the method according to the present invention is essential.

Figure 11A:
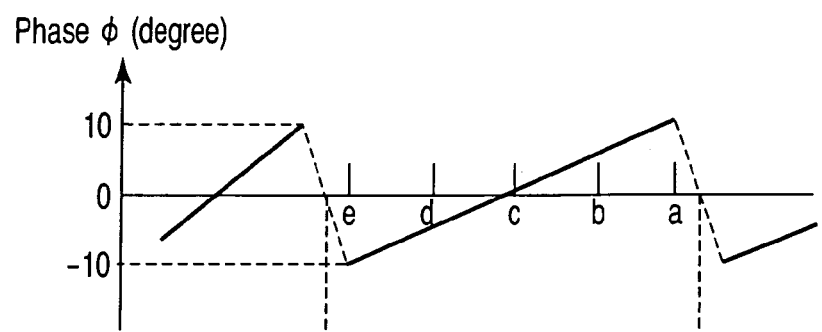
FIGS. 11A and 11B are views showing a state in which the phase distribution depicted in FIG. 10B is divided into a phase distribution obtained by multiple phase steps and a phase distribution having a homogeneous gradient.
Figure 11B:
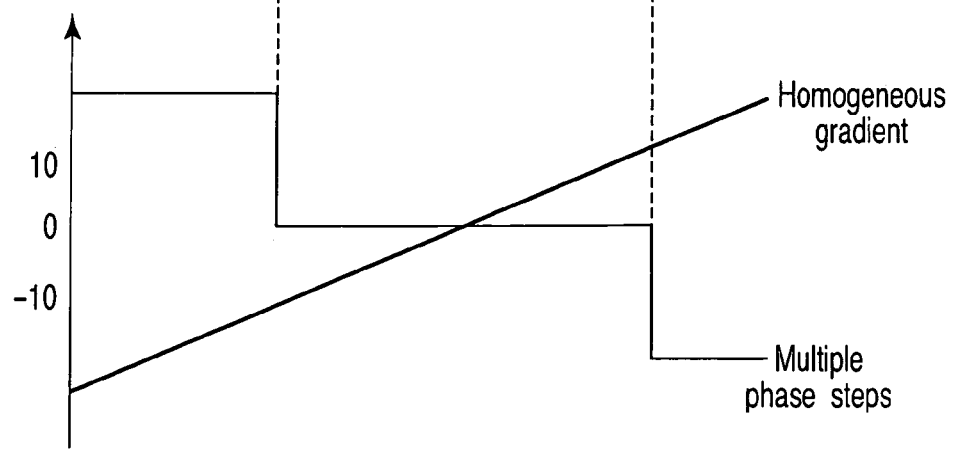

Further, in the present invention, the in-plane shift at the bottom peak in the light intensity distribution with the inverse peak shape can be suppressed by combining the three-value phase modulation with oblique illumination described in Jpn. Pat. Appln. KOKAI Publication No. 2004-232708 and an application in your counter (incorporated herein as a reference) based on this publication in detail. This point will now be described. A factor of the in-plane shift of the bottom peak will be first explained. The phase distribution described in conjunction with FIG. 10B (shown in FIG. 11A) is separated into a phase distribution based on multiple phase steps and a phase distribution having a homogeneous gradient as shown in FIG. 11B. A phase of the homogeneous gradient is equivalent to an effect that a light ray obliquely advances on the processed substrate 4.

For example, assuming that an interval (one cycle) d of saw-tooth-like steps of the phase φ=5 μm, a wavelength λ of a light used=0.248 μm and a phase angle θ=30° as typical values, an inclination angle S (radian) at which a light ray is inclined is represented by the following Expression (7).

$$S = \lambda \times \theta / 2\pi / d \qquad (7)$$
$$= 0.248 \times (\pi/6) / 2\pi / 5$$
$$= 0.0041 \text{ rad}$$

This angle S can be ignored since it is sufficiently small as compared with an angle which determines an image side numeral aperture NA (e.g., 0.13) of the image formation optical system 3. Therefore, it can be considered that the phase distribution having the homogeneous gradient is ignored, the light intensity distribution with the inverse peak shape is generated by the phase distribution based on multiple phase steps and the in-plane shift of the bottom peak in the same direction is generated. First, an approximation is performed provided that an illumination light beam with respect to the light modulation element having multiple phase steps is a parallel light beam vertical to an incidence surface of the light modulation element. This is a state called coherent image formation.

Further, considering image formation at a defocus position of the image formation optical system 3, it is decided that an immediate three-dimensional light intensity distribution of a light modulation element having multiple phase steps is obtained and the three-dimensional light intensity distribution is image-formed immediately after an irradiation target surface (a semiconductor film of the processed substrate 4) by the image formation optical system 3. A three-dimensional light intensity distribution immediately before the irradiation target surface is symmetrical to the three-dimensional light intensity distribution immediately after the irradiation target surface. The fact that these assumptions or approximations have the sufficient accuracy is described in the embodiment.

The immediate three-dimensional light intensity distribution of the light modulation element having multiple phase steps is analytically obtained as a Becke's line generated by Fresnel diffraction at the boundary of phase objects (an area known as Becke's line). In regard to this point, reference can be made a document such as "Applied Optics I" by Tsuruta, Baifukan Co., Ltd, pp. 172-175, 1990 (incorporated herein as a reference). According to this document, a three-dimensional light intensity distribution formed immediately after a phase step having a phase difference substantially smaller than 180° has the darkest part, i.e., a bottom peak at a position deviated from a position of the phase step to a low refraction factor side or a side where a phase is advance (a phase advance side).

Furthermore, a displacement quantity (distance) x of the bottom peak with the position of the phase step being determined as a reference becomes large in proportion to a square root of a distance z from the light modulation element. That is, the displacement quantity x of the bottom peak from the phase step is represented by the following Expression (8). In Expression (8), λ is a wavelength of a light used, z is a distance of the three-dimensional light intensity distribution from the light modulation element, and $\omega_0$ is a constant value which is determined by a phase difference of the phase step and corresponds to the bottom peak.

$$x = \omega_0 \times (\lambda \cdot z/2)^{1/2} \qquad (8)$$

Figure 12:
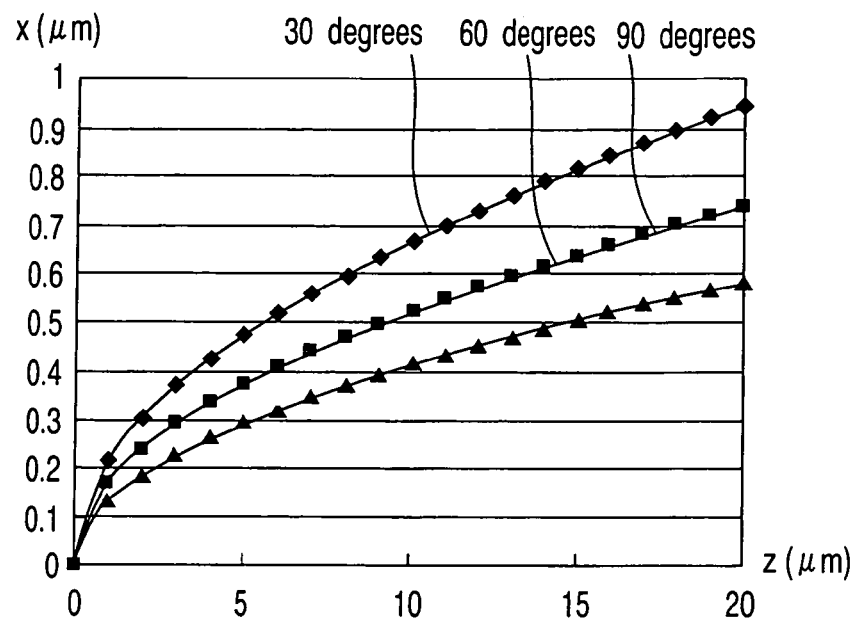
FIG. 12 is a view showing a relationship between a displacement quantity x of a bottom peak and a distance z from a phase shifter having a three-dimensional light intensity distribution in oblique illumination.

For example, when the phase difference of the phase step is 90°, the bottom peak appears at a position of $\omega_0$=0.37 based on an analysis result of Becke's line. Therefore, assuming that λ=0.248 μm and z=10 μm, the displacement quantity x of the bottom peak from the phase step is x=041 μm. FIG. 12 shows a relationship between the displacement distance x of the bottom peak and the distance z of the three-dimensional light intensity distribution from the light modulation element when the wavelength of a light used is constant to λ=0.248 μm and the phase difference of the phase step is set to 30°, 60° and 90°, respectively.

Figure 13:
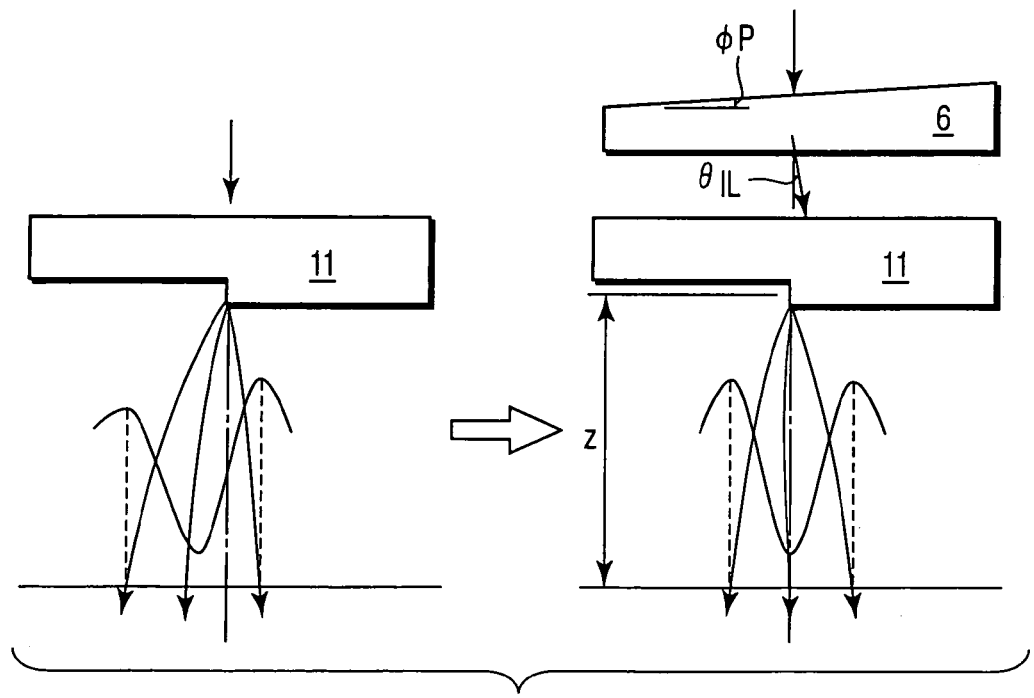
FIG. 13 is a view showing a state in which a displacement of the bottom peak can be substantially avoided by irradiating a light modulation element having multiple phase steps with an oblique illumination light.

In oblique illumination, as shown in FIG. 13, a wedge-shaped prism 6 is arranged in close proximity to the light modulation element 11 in an optical path between the illumination system 2 and the light modulation element 11 having multiple phase steps (corresponding to the light modulation element 1 having the three-value phase modulation in case of this embodiment). Furthermore, a displacement (an in-plane shift) of the bottom peak due to defocusing is substantially avoided by illuminating the light modulation element 11 with an illumination light beam inclined in a direction (the lateral direction) orthogonal to a step line (a line extending vertically with respect to the page space of FIG. 13) of the phase step of the light modulation element 11 by the effect of the wedge-shaped prism 6.

A description will now be given as to a point that the displacement of the bottom peak is substantially avoided by the illumination light beam inclined by oblique illumination hereinafter.

As general characteristics of Fresnel diffraction, a diffraction image on the irradiation target surface is changed into a shape converted into a conversion coordinate ($X_m$) of the following Expression (9) by inclining an angle of the illumination light which is indicated by an arrow and enters the light modulation element 11 by an amount corresponding to $\theta_{IL}$ from the vertical direction in the lateral direction.

$$x_m = X - \tan\theta_{IL} \cdot z \quad (9)$$

That is, the light intensity distribution on the irradiation target surface formed at a position apart from the light modulation element 11 by the distance z is shifted in the lateral direction by a distance represented by ($\tan\theta_{IL} \cdot z$) in a direction along which the illumination light obliquely advances. Therefore, the displacement of the bottom peak in the lateral direction due to defocusing can be corrected by adjusting an inclination angle $\theta_{IL}$ of the illumination light beam. In this case, although it is desirable to match a position of the bottom peak with a position of the step or phase shift line of the phase step of the light modulation element 11 with respect to all values of the distance z, this is impossible since a dark area is curved.

However, a rough correction is enabled within a range of $-z_0$ to $+z_0$ by determining a target distance $z_0$ and matching the position of the bottom peak with the position of the step line of the phase step of the light modulation element 11 at this distance $z_0$. An optimum incidence angle $\theta_{IL0}$ of the illumination light required for this correction satisfies the following Expression (10) and is presented by the following Expression (11).

$$x_m = x_0 - \tan\theta_{IL0} \cdot z_0 = 0 \quad (10)$$

$$\theta_{IL0} = \tan^{-1}[\omega_0 \cdot \{\lambda/(2 \cdot z_0)\}^{1/2}] \quad (11)$$

Specifically, when the phase difference of the phase step of the light modulation element 11 is 90°, $\omega_0 = 0.37$ is achieved. Therefore, assuming that $\lambda = 0.248$ μm and $z_0 = 10$ μm, the optimum incidence angle of the illumination light beam is $\theta_{IL0} = 2.4°$ (0.041 rad (radian)). FIG. 14 shows a relationship between the phase difference (degrees) of the phase step of the light modulation element 11 and the optimum incidence angle $\theta_{IL0}$ (degrees) of the illumination light beam under the same condition. In FIG. 14, a horizontal axis represents the phase difference and the vertical axis represents the optimum incidence angle, and this figure shows a result of calculating the optimum incidence angle from Expression (11) when a phase difference is 30°, 60° and 90°, respectively.

As described above, in the three-dimensional light intensity distribution formed immediately after the phase step having a phase difference substantially smaller than 180°, the bottom peak is shifted in the lateral direction toward the phase advance side from the position of the phase step in case of defocusing. Therefore, in this case, in order to correct the displacement of the bottom peak due to defocusing, it is good enough to illuminate the light modulation element 11 along a direction containing a component which is directed from the phase advance side to the phase delay side of the phase step. On the other hand, in the three-dimensional light intensity distribution formed immediately after the phase step having a phase difference substantially larger than 180°, the bottom peak is shifted from the position of the phase step to the phase delay side. Therefore, in this case, in order to correct the displacement of the bottom peak due to defocusing, it is good enough to illuminate the light modulation element 11 along a direction containing a component directed from the phase delay side to the phase advance side of the phase step.

In the above description of "oblique illumination", it is assumed that the image formation optical system 3 is a magnification optical system when obtaining the optimum incidence angle $\theta_{IL0}$ of the illumination light beam. In general, when using the image formation optical system whose magnification is 1/M, an inclination angle $\theta_{IL0}$ (= $\theta_{IL0}'/M$) of the illumination light beam with which the light modulation element 11 should be actually irradiated is obtained by calculating the optimum incidence angle $\theta_{IL0}'$ of the light beam by the similar calculation converted to the image surface side of the image formation optical system and dividing a value of the obtained angle $\theta_{IL0}'$ by M.

As shown in FIG. 13, when "oblique illumination" is realized by providing the wedge-shaped prism (a small-angle prism or a wedge prism) 6 immediately before the light modulation element 11, a relationship represented by the following Expression (12) is achieved between a prism angle (an apex angle of the wedge-shaped prism 6) $\phi_P$ and a deflection angle $\theta_{IL}$ of a vertical incident light ray.

$$\theta_{IL} \approx \phi_P(n-1) \quad (12)$$

In this expression, n is a refraction index of an optical material forming the wedge-shaped prism 6. Specifically, in order to assure the deflection angle $\theta_{IL}$ equal to the optimum incidence angle $\theta_{IL0} = 2.4°$ of the illumination light when the phase difference of the phase step of the light modulation element 11 is 90°, it can be understood that using the wedge-shaped prism having a prism angle of $\phi_P = 4.8°$ can suffice when a refraction index of the optical material forming the wedge-shaped prism 6 is n=1.508.

In oblique illumination, the present invention is not restricted to the wedge-shaped prism, and it is possible to use a modification in which an aperture diaphragm 2g is arranged at or in the vicinity of an exit pupil (i.e., in the vicinity of a projection surface of the second fly-eye lens 2e) of the illumination system 2. In this case, the light modulation element 11 can be illuminated with an illumination light which is inclined at a necessary angle $\theta_{IL}$ from the vertical line by decentering, i.e., inclining an aperture portion (a light transmission portion) 2ga of the aperture diaphragm 2g with respect to an optical axis AX by a predetermined distance.

To sum up, when the light modulation element having two phase steps (one shift line) according to the prior art is used, the in-plane shift of the bottom peak alternately occurs in both regular illumination and oblique illumination. Further, when the light modulation element having two phase steps is used, a control over the phase angle of the element is arbitrary, and production is easy. On the other hand, when the light modulation element having multiple phase steps according to the prior art is used, the in-plane shift of the bottom peak occurs in the same direction in regular illumination, and the in-plane shift of the bottom peak is suppressed in oblique illumination. Furthermore, when the light modulation element having multiple phase steps is used, a control over the phase angle is discrete (360/n) and production is difficult.

Conversely, when the three-value phase modulation technique according to the present invention is used, the in-plane shift of the bottom peak appears in the same direction in regular illumination, and the in-plane shift of the bottom peak is suppressed in oblique illumination. Moreover, when the three-value phase modulation technique is used, a control over the phase angle of the light modulation element is arbitrary, and production is easy. That is, the three-value phase modulation technique according to the present invention has both a merit of the two phase steps and a merit of the multiple phase steps. Embodiments of this conformation will now be described hereinafter.

First Embodiment

A first embodiment uses a KrF excimer laser beam source 1 which emits a laser light beam having a wavelength $\lambda=248$ nm (0.248 µm) and an image formation optical system 3 which has an equal magnification (an image formation magnification=1) and an image side numeral aperture NA=0.13. Moreover, a phase angle $\theta=40°$ in the phase modulation area of the light modulation element 1 is determined, and the phase modulation area of the light modulation element comprises an area 1a having a phase modulation value of 0 degree, an area 1b having a phase modulation value of +40° and an area 1c having a phase modulation value of −40°. Additionally, as shown in FIGS. 9A and 9B, in the diagram with respect to the phase angle $\theta=40°$, it is assumed that a target light intensity is 0.7 and a target phase interval is 10°, and five points a to e are plotted.

Figure 16:
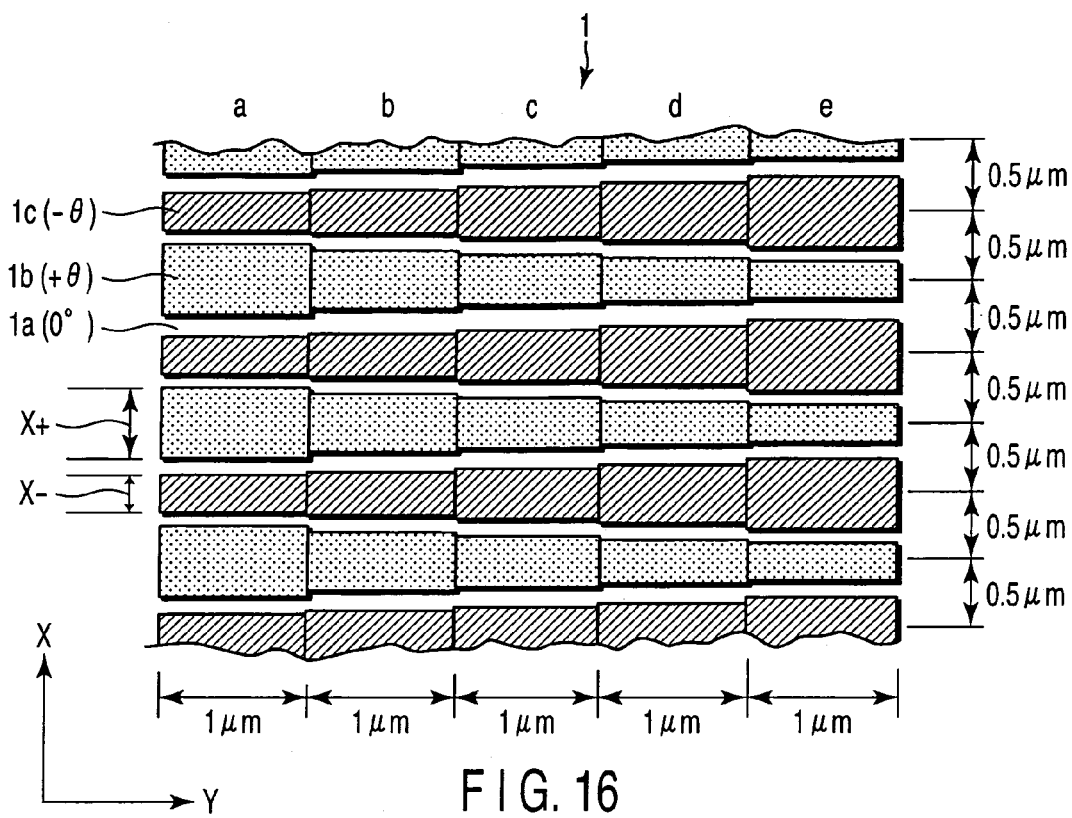
FIG. 16 is a view schematically showing a configuration of a phase modulation area of a light modulation element according to a first embodiment.

As a result, in the first embodiment, a light modulation element having phase modulation areas as shown in FIG. 16 can be obtained. In the light modulation element 1 according to the first embodiment, an intercentral distance in the X direction between the rectangular second area 1b of +40° and the rectangular third area 1c of −40° vertically arranged with the first rectangular area 1a of zero therebetween is 0.5 µm, and a dimension of each of the area 1b of +40° and the area 1c of −40° in the Y direction (the lateral direction) is 1 µm. Further, X direction dimensions $X_+$ of the areas 1b of +40° aligned in the Y direction are 0.5 µm, 0.418 µm, 0.35 µm, 0.298 µm and 0.26 µm in accordance with the plot points a to e in the order from the left side in the figure.

Conversely, X direction dimensions $X_-$ of the areas 1c of −40° aligned in the Y direction are 0.26 µm, 0.298 µm, 0.35 µm, 0.418 µm and 0.5 µm in accordance with the plot points a to e in the order from the left side in the figure. In the light modulation element 1 according to the first embodiment, the phase modulation areas as shown in FIG. 16 are two-dimensionally repeatedly formed along the X direction and the Y direction or one-dimensionally repeatedly formed along the Y direction.

Figure 17A:
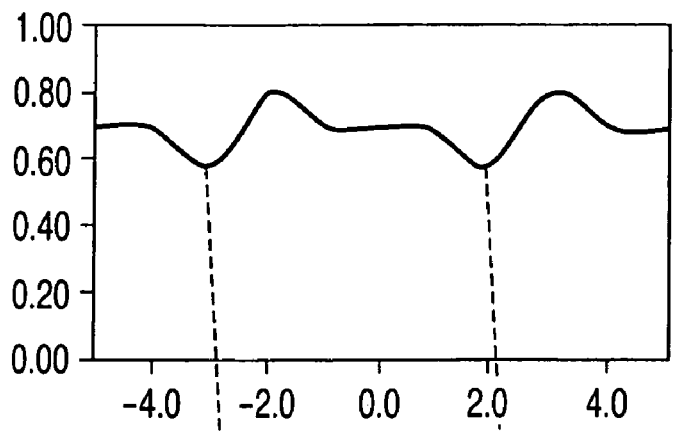
FIGS. 17A to 17C are views showing light intensity distributions obtained by usual illumination using the light modulation element according to the first embodiment.
Figure 17B:
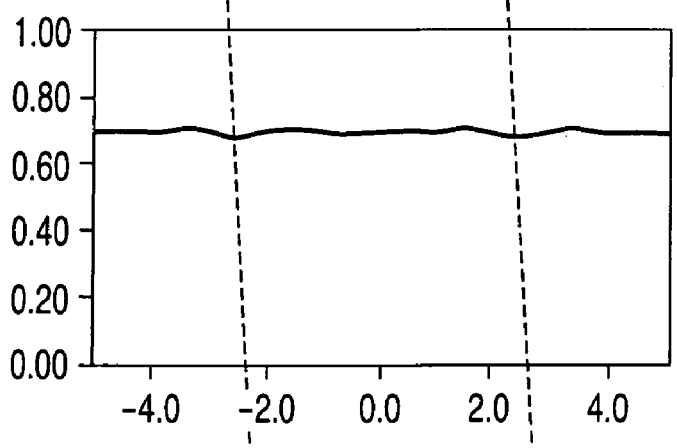
Figure 17C:
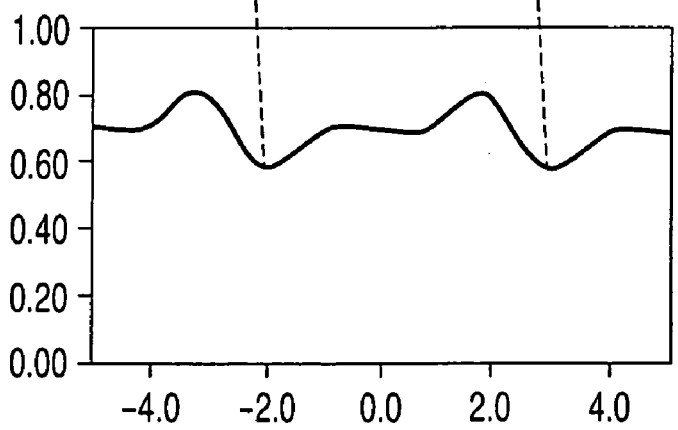
Figure 18A:
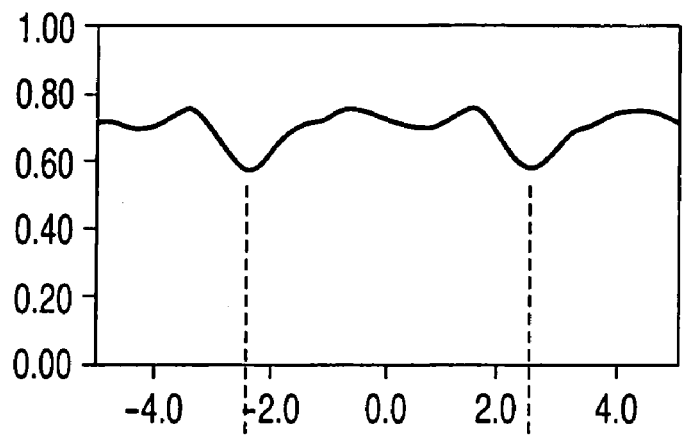
FIGS. 18A to 18C are views showing light intensity distributions obtained by oblique illumination using the light modulation element according to the first embodiment.

In the first embodiment, such light intensity distributions as shown in FIGS. 17A to 17C are obtained with respect to each unit phase modulation area on the processed substrate 4 by regular illumination which uses the light modulation element 1 having a plurality of unit phase modulation areas shown in FIG. 16 and causes an illumination light beam to vertically enter the light modulation element 1. Furthermore, such light intensity distributions as shown in FIGS. 18A to 18C are obtained on the processed substrate 4 by oblique illumination which uses the light modulation element 1 having a phase modulation pattern shown in FIG. 16 and causes an illumination light beam to obliquely enter the light modulation element 1.

It has been confirmed that a light intensity distribution with a symmetrical inverse peak shape is formed with a constant intensity at a focus position of the image formation optical system 3 as designed as shown in FIG. 17B in case of regular illumination. Moreover, it has been confirmed that a position of each bottom peak in the light intensity distribution with the inverse peak shape to be formed is shifted in the same lateral direction at a defocus position slightly vertically moved from the focus position of the image formation optical system 3 as shown in FIGS. 17A and 17C, respectively. In this case, although the bottom peak is deep due to defocusing, this is a tendency common to the light modulation elements of two phase steps, multiple phase steps and the three-value phase modulation as long as regular illumination is used.

Figure 18B:
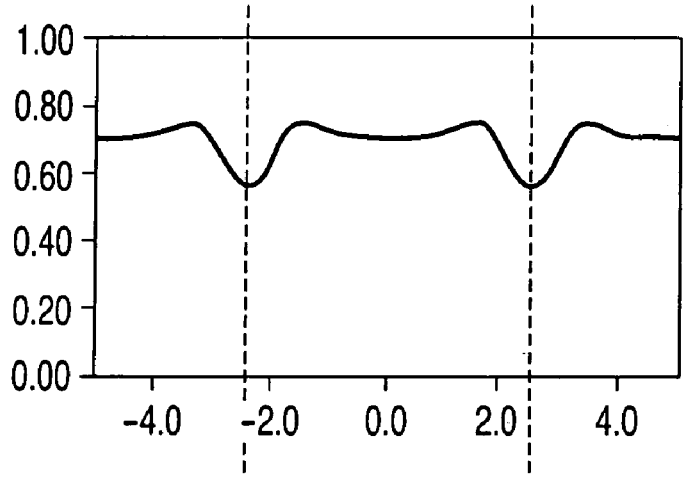
Figure 18C:
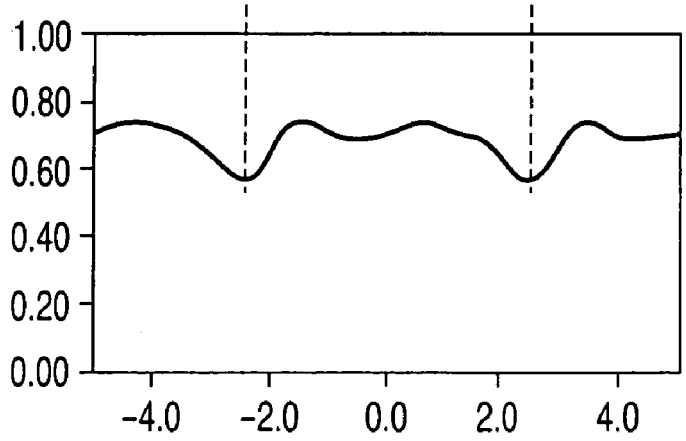

On the other hand, it has been confirmed that the light intensity distribution with the symmetrical inverse peak shape is likewise formed at the focus position of the image formation optical system 3 as shown in FIG. 18B in case of oblique illumination. Further, it has been confirmed that a position of each bottom peak of the light intensity distribution having the inverse peak shape to be formed is hardly shifted as shown in FIGS. 18A and 18C even when slightly vertically moved from the focus position of the image formation optical system 3.

Furthermore, as secondary effects, it has been confirmed that the depth of the bottom peak is hardly changed by defocusing and that the symmetry of the light intensity distribution with the inverse peak shape is excellently maintained even if defocusing is performed. The fact that the symmetry of the light intensity distribution with the inverse peak shape is maintained even if defocusing is carried out is desirable for avoiding destruction of a semiconductor film due to ablation. In oblique illumination in this embodiment, a wedge-shaped prism 6 having a refraction index n=1.508 and a prism angle (an apex angle of the wedge-shaped prism 6) $\phi_P=1.2°$ is used in order to realize an optimum incidence angle $\theta_{ILO}$ of the illumination light beam (a deflection angle $\theta_{IL}$ by the wedge-shaped prism 6)=2.4°.

In the first embodiment, an a-Si semiconductor film of the processed substrate 4 is irradiated with a light beam phase-modulated by the light modulation element 1 subjected to regular illumination or oblique illumination. As a result, a crystal grows in the lateral direction from a position corresponding to the phase step of the light modulation element 1, and a crystal grain can be thereby formed the film. At this moment, a position of the crystal grain is not substantially shifted in the plane even if the processed substrate 4 is slightly vertically shifted from the focus position (a focal position) of the image formation optical system 3 by 10 µm, and a part of the semiconductor film is not destroyed due to ablation. That is, in the first embodiment, the light intensity distribution with the inverse peak shape having a desired bottom peak intensity can be stably formed at a desired position, and hence crystal grains with equivalent shapes and sizes can be formed to the semiconductor film.

Second Embodiment

A second embodiment uses a KrF excimer laser beam source 1 which emits a laser light beam having a wavelength $\lambda=248$ nm (0.248 µm) and an image formation optical system 3 which has an equal magnification (an image formation magnification=1) and an image side numeral aperture NA=0.13 like the first embodiment. Moreover, like the first embodiment, it is determined that a phase angle $\theta=40°$ in the phase modulation area of the light modulation element 1, and the phase modulation area comprises a plurality of unit areas each of which includes a first area 1a having a phase modulation value of zero, a second area 1b having a phase modulation value of +40° and a third area 1c having a phase modulation value of −40°. Additionally, like the first embodiment, as shown in FIG. 19, in the diagram with respect to the phase angle $\theta=40°$, it is determined that a target light intensity is 0.7 and a target phase interval is 10°, and five points a to e are plotted.

Figure 19:
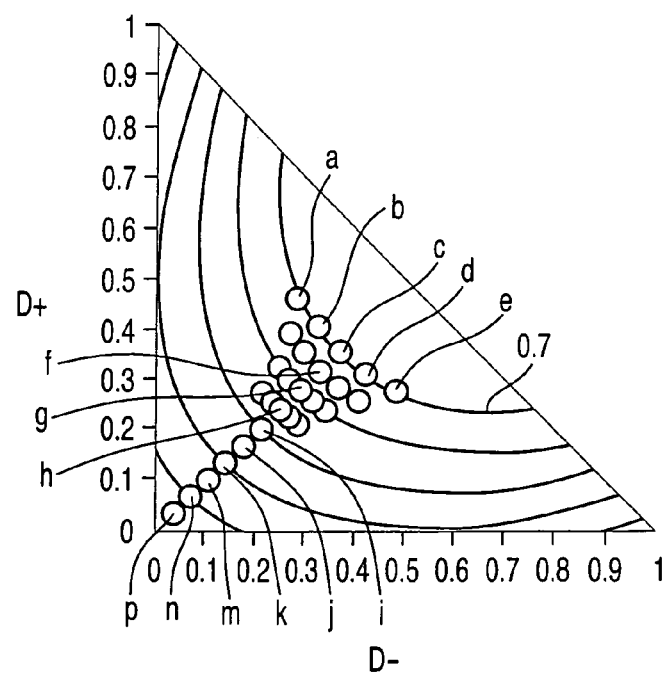
FIG. 19 is a view showing a state in which necessary points are plotted on the diagram in a second embodiment.

In the second embodiment, however, as different from the first embodiment, a plurality of points added besides five points a to e in the diagram shown in FIG. 19 in order to form a light intensity gradient distribution for the crystal growth in addition to the light intensity distribution with the inverse peak shape. Specifically, on a contour line representing the phase $\phi$ of zero, nine points f to p are sequentially added between 0.7 and 1 of the light intensity I from the point a side. Additionally, four points of different phases $\phi$ are respectively added on the contour line of the same light intensity I at equal angular intervals with respect to the points f to h.

Figure 20:
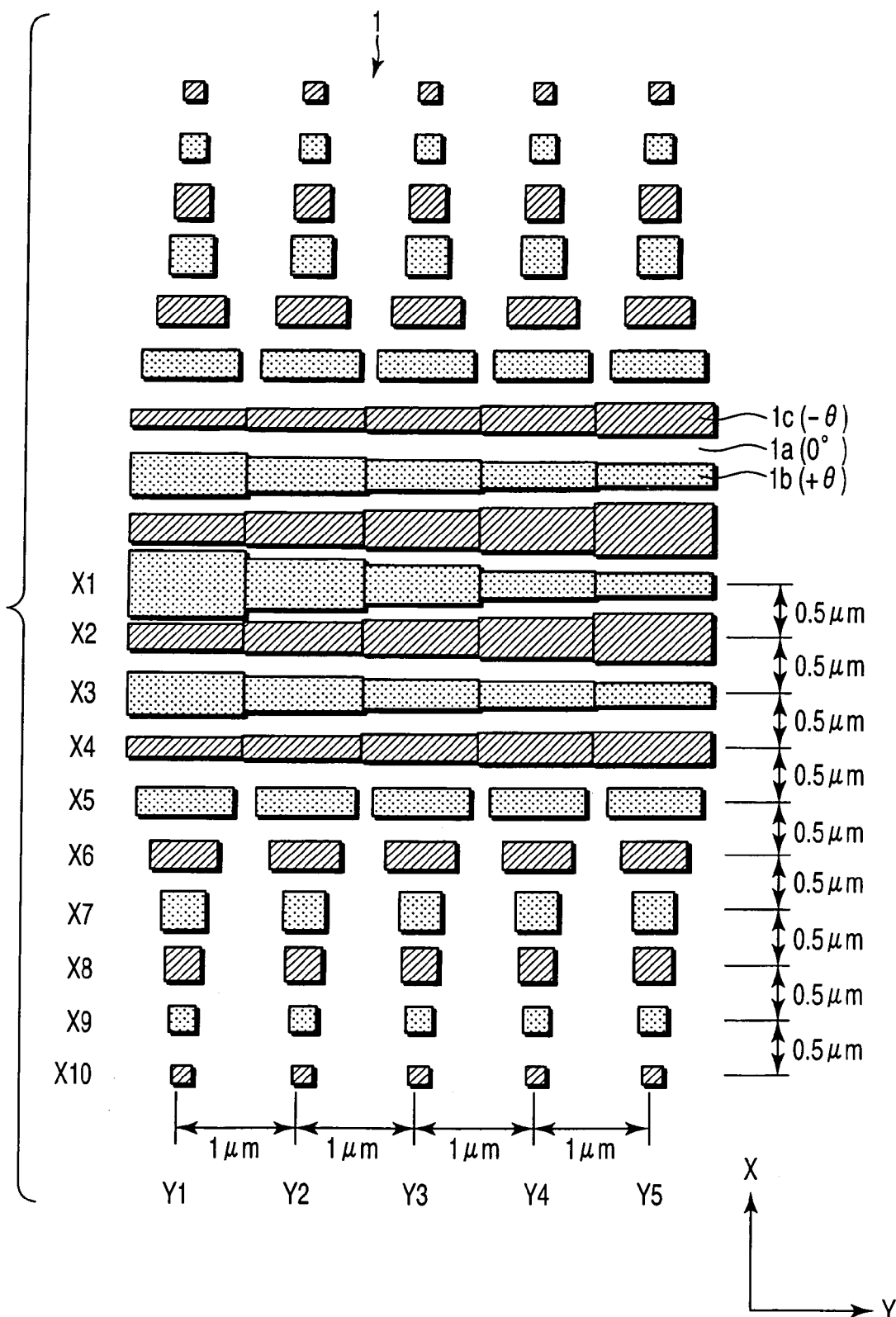
FIG. 20 is a view schematically showing a configuration of phase modulation areas of a light modulation element according to the second embodiment.

As a result, in the second embodiment, the light modulation element 1 having such a plurality of unit phase modulation areas as shown in FIG. 20 can be obtained. In the light modulation element 1 according to the second embodiment, an intercentral distance along the X direction between the second rectangular area 1b of +40° and the third rectangular area 1c of −40° vertically arranged with the first rectangular area 1a of zero therebetween is 0.5 μm. Further, a Y direction dimension of the five second areas 1b of +40° aligned in a line X1 in accordance with the points a to e, the five third areas 1c of −40° aligned in a line X2 in accordance with the point f and four associated points, the five second areas 1b of +40° aligned in a line X3 in accordance with the point g and four associated points and the five third areas 1c of −40° aligned in a line X4 in accordance with the point h and four associated points is 1 μm.

Furthermore, an intercentral distance along the X direction of the five areas 1b of +40° aligned in a line X5 at intervals in accordance with the point i, the five areas 1c of −40° aligned in a line X6 at intervals in accordance with the point j, the five areas 1b of +40° aligned in a line X7 at intervals in accordance with the point k, the five areas 1c of −40° aligned in a line X8 at intervals in accordance with the point m, the five areas 1b of +40° aligned in a line X9 at intervals in accordance with the point n, and the five areas 1c of −40° aligned in a line X10 at intervals in accordance with the point p is 1 μm.

Now, paying attention to the five areas 1b of +40° aligned in the line X1, the area 1b in a row Y1 corresponds to the point a, the area 1b in a row Y2 corresponds to the point b, the area 1b in a row Y3 corresponds to the point c, the area 1b in a row Y4 corresponds to the point d, and the area 1b in a row Y5 corresponds to the point e. This is also true to the five areas 1b or 1c aligned in the lines X2 to X4. On the other hand, the five areas 1b or 1c aligned in the lines X5 to X10 at intervals correspond to the points i to p in accordance with each line, respectively.

Specifically, X direction distances $X_+$ of the five second areas 1b aligned in the line X1 are 0.6 μm, 0.458 μm, 0.35 μm, 0.276 μm and 0.24 μm in accordance with the plot points a to e in sequence from the left side in the figure. Moreover, X direction distances $X_+$ of the five third areas 1c of −40° aligned in the line X2 are 0.228 μm, 0.261 μm, 0.312 μm (corresponding to the plot point f), 0.385 μm and 0.475 μm in sequence from the left side in the figure. Additionally, X direction distances $X_+$ of the five second areas 1b of +40° aligned in the line X3 are 0.35 μm, 0.312 μm, 0.274 μm (corresponding to the plot point g), 0.245 μm and 0.216 μm in sequence from the left side in the figure.

Further, X direction distances $X_+$ of the five areas 1c aligned in the line X4 are 0.209 μm, 0.224 μm, 0.238 μm (corresponding to the plot point h), 0.257 μm and 0.276 μm in sequence from the left side in the figure. Furthermore, an X direction distance $X_+$ and a Y direction distance $Y_+$ of the five areas 1b aligned in the line X5 at intervals in accordance with the plot point i are 0.235 μm and 0.8 μm, respectively. Moreover, an X direction distance $X_+$ and a Y direction distance $Y_+$ of the five areas 1c of −40° aligned in the line X6 at intervals in accordance with the plot point j are 0.28 μm and 0.6 μm, respectively.

Moreover, both the X directional size $X_+$ and the Y directional size $Y_+$ of the five areas 1b of +40° aligned in the line X7 at intervals in accordance with the plot point k are 0.366 μm. Additionally, both the X directional size $X_+$ and the Y directional size $Y_+$ of the five areas 1c of −40° aligned in the line X8 at intervals in accordance with the plot point m are 0.316 μm. Further, both the X directional size $X_+$ and the Y directional size $Y_+$ of the five areas 1b of +40° aligned in the line X9 at intervals in accordance with the plot point n are 0.257 μm. Furthermore, both the X directional size $X_+$ and the Y directional size $Y_+$ of the five areas 1c of −40° aligned in the line X10 at intervals in accordance with the plot point p are 0.182 μm.

Although attention is paid to the phase modulation area lower than the five areas 1b of +40° aligned in the line X1 in the figure in the above description, the phase modulation area of the light modulation element 1 according to the second embodiment has a symmetrical configuration with respect to a central line cutting across the center of the five areas 1b of +40° aligned in the line X1 in the Y direction. In the light modulation element 1 according to the second embodiment, such a unit phase modulation area as shown in FIG. 20 is two-dimensionally repeatedly formed along the X direction and the Y direction or one-dimensionally repeatedly formed along the Y direction.

In the second embodiment, such unit light intensity distributions (distributions represented by contour lines of light intensities) as shown in FIGS. 21A to 21C are obtained on the processed substrate 4 by oblique illumination which uses the light modulation element 1 having a plurality of unit phase modulation areas shown in FIG. 20 and causes an illumination light to obliquely enter the light modulation element 1. It is to be noted that, in oblique illumination, a wedge-shaped prism 6 having a refraction index n=1.508 and a prism angle $\phi p$ (an apex angle of the wedge-shaped prism 6)=1.2° is used in order to realize an optimum incidence angle $\theta_{ILO}$ (a deflection angle $\theta_{IL}$ by the wedge-shaped prism 6)=2.4° of the illumination light, like the first embodiment.

It has been confirmed that the light intensity distribution with the symmetrical inverse peak shape is formed along the Y direction at intervals at a focus position of the image formation optical system 3 as shown in FIG. 21B in this manner. Additionally, it has been confirmed that a position of the bottom peak of the light intensity distribution with the inverse peak shape to be formed is hardly shifted even when vertically slightly moved from the focus position of the image formation optical system 3, as shown in FIGS. 21A to 21C.

Further, in the light modulation element 1 according to the second embodiment, although the central portions of the phase modulation areas depicted in FIGS. 20A to 21C have a pattern similar to that of the first embodiment, the light intensity gradient distribution for the crystal growth is generated along the X direction orthogonal to the Y direction along which a series of the inverse-peak-shaped light intensity distributions are formed by decreasing the both duties $D_+$ and $D_-$ (corresponding to movement of the duties to (0, 0) in the diagram of FIG. 19) as distanced in the vertical direction in the figure. This light intensity gradient distribution for the crystal growth is increased in accordance with a distance from a line segment in the Y direction connecting the bottom peaks of a series of inverse-peak-shaped light intensity distributions.

In this manner, the combined light intensity distribution obtained from the light intensity gradient distribution and the light intensity distribution with the inverse peak shape, i.e., the light intensity distribution in which the V-shaped pattern and the inverse-peak-shaped pattern are repeated is formed on the surface of the processed substrate 4. As a result, as schematically shown in FIG. 22, the crystal growth in the lateral direction from a crystal nucleus along a gradient direction (the X direction or the lateral direction) of the light intensity in the unit light intensity gradient distribution having a one-dimensional Y shape can be realized, thereby generating each crystal grain 20 having a large particle size. Furthermore, it has been also confirmed that the position of the bottom peak is not substantially shifted in the plane, that the depth of the bottom peak is not substantially changed and that the symmetry of the light intensity distribution with the inverse peak shape can be excellently maintained even if defocusing is carried out.

In the second embodiment, an a-Si semiconductor film of the processed substrate 4 is irradiated with a light beam phase-modulated by the light modulation element 1 subjected to oblique illumination. As a result, a crystal grain having a large particle size can be subjected to two-dimensional position control and generated by effecting the crystal growth from a position corresponding to the phase step of the light modulation element 1. At this time, even if the processed substrate 4 is slightly upwardly and downwardly moved in the vertical direction by 10 μm, from the focus position (a focal position) of the image formation optical system 3, a position of a crystal grain is not substantially shifted in the plane, and a part of the semiconductor film is not destroyed due to ablation.

Figure 23A:
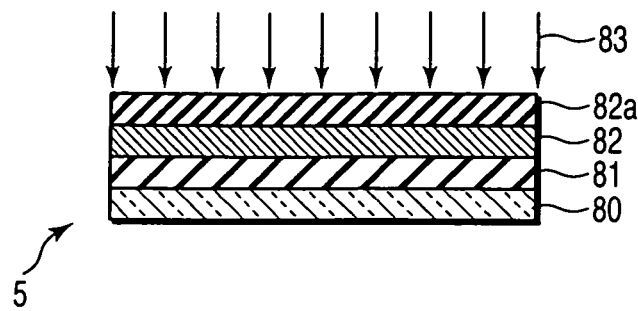
FIGS. 23A to 23E are process cross-sectional views showing processes of manufacturing an electronic device by using the crystallization apparatus according to the embodiment.

FIGS. 23A to 23E are process cross-sectional views showing processes of manufacturing an electronic device in an area crystallized by using the crystallization apparatus according to this embodiment. As shown in FIG. 23A, there is prepared a processed substrate 5 which is obtained by forming an underlying film 81 (e.g., a laminated layer of SiN layer having a thickness of 50 nm and $SiO_2$ layer having a thickness of 100 nm), an amorphous semiconductor film 82 (a semiconductor film made of, e.g., Si, Ge or SiGe having a film thickness of approximately 50 to 200 nm) and a cap film 82a (e.g., an $SiO_2$ film having a film thickness of 30 to 300 nm), on a transparent insulating substrate 80 (made of e.g., alkali glass, quartz glass, plastic or polyimide), by using a chemical vapor deposition method or a sputtering method. Then, a predetermined area in a surface of the amorphous semiconductor film 82 is irradiated with a laser beam 83 (e.g., a KrF excimer laser beam or an XeCl excimer laser beam) by using the crystallization apparatus according to this embodiment.

Figure 23B:
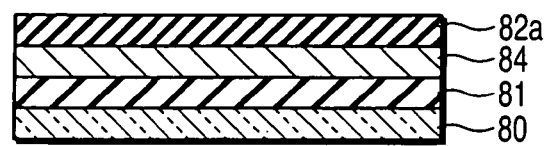
Figure 23C:
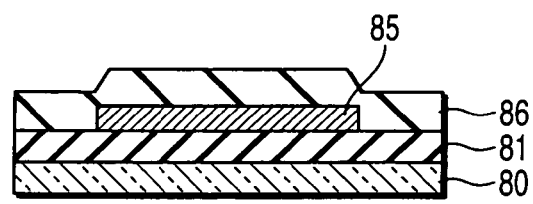
Figure 23D:
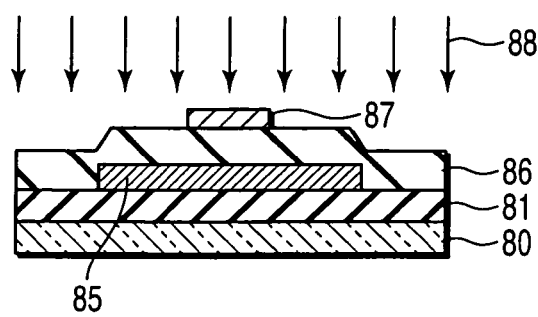
Figure 23E:
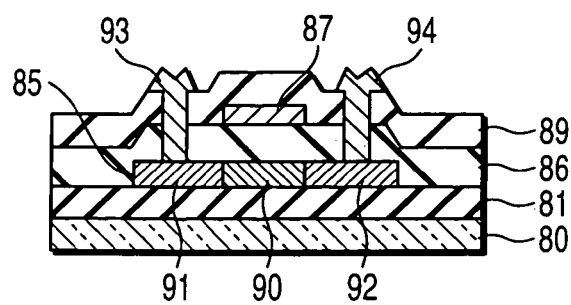
Figure 24A:
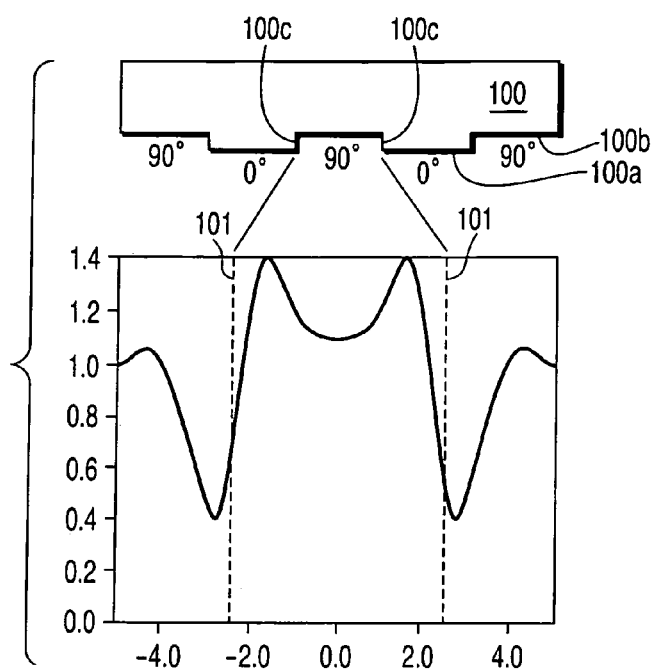
FIGS. 24A to 24C are views showing simulation results of light intensity distributions obtained by two phase steps having a phase difference of 90°.
Figure 24B:
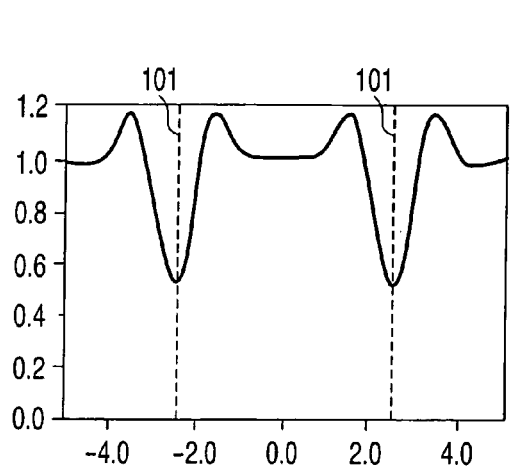
Figure 24C:
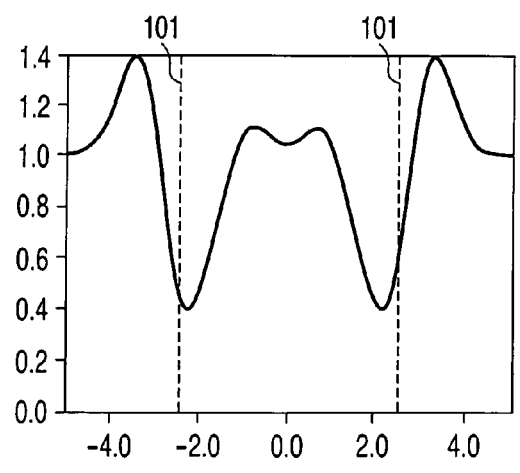
Figure 25A:
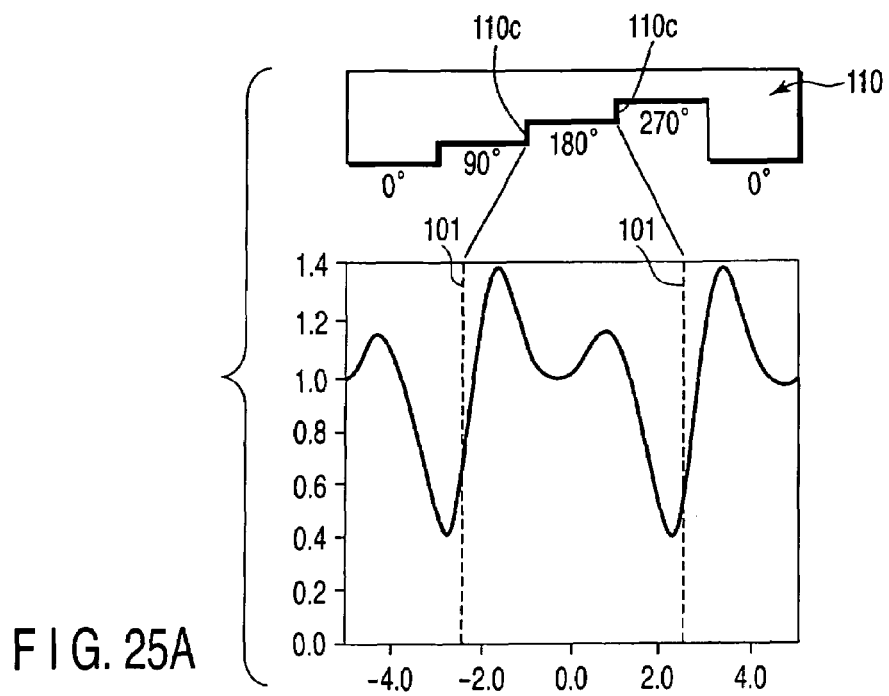
FIGS. 25A to 25C are views showing simulation results of light intensity distributions obtained by four phase steps having a phase difference of 90°.
Figure 25B:
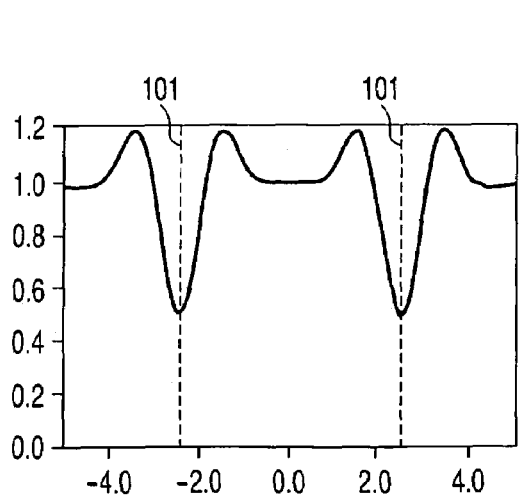
Figure 25C:
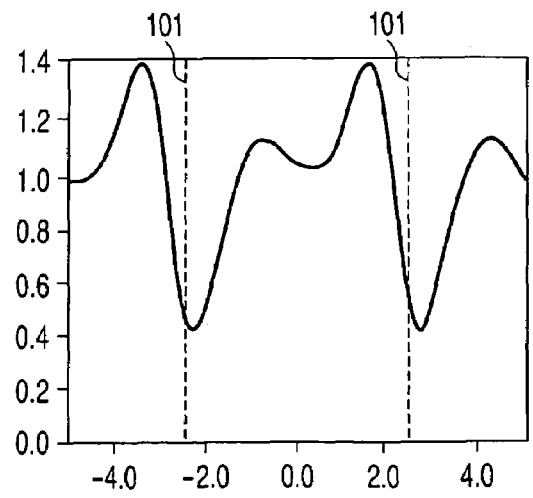
Figure 26:
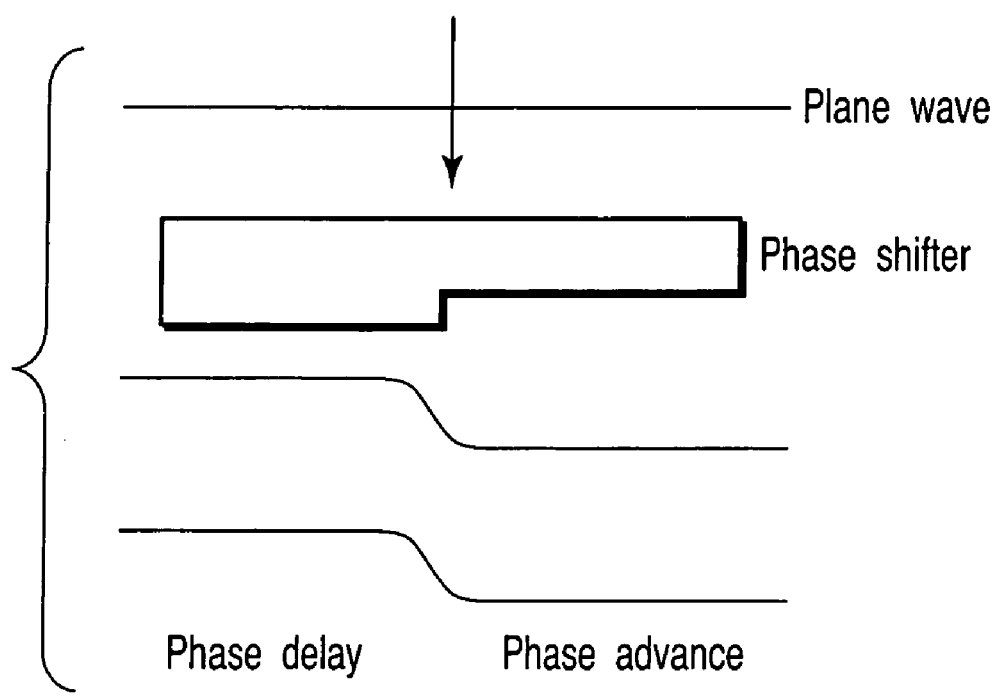
FIG. 26 is a view for explaining definition of a phase delay and a phase advance.

In this manner, as shown in FIG. 23B, a polycrystal semiconductor film or a single-crystallized semiconductor film 84 having a crystal of a large particle size is generated. Then, after the cap film 82a is removed from the crystallized semiconductor film 84 by etching, as shown in FIG. 23C, the polycrystal semiconductor film or the single-crystallized semiconductor film 84 is processed into an island-shaped semiconductor film 85 (in figure, only one of a plurality films is shown) which becomes an area in which, e.g., a thin film transistor is formed by using a photolithography technique, and an $SiO_2$ film having a film thickness of 20 to 100 nm is formed as a gate insulating film 86 on the upper surface of the semiconductor film 85 by using the chemical vapor deposition method or the sputtering method. Furthermore, as shown in FIG. 23D, a gate electrode 87 (e.g., made of silicide or MoW) is formed on the gate insulating film, and impurity ions 88 (phosphor in case of an N channel transistor, and boron in case of a P channel transistor) are implanted into the island crystallized film 85, with the gate electrode 87 being used as a mask. Thereafter, annealing processing (e.g., one hour at 450° C.) is carried out in a nitrogen atmosphere in order to activate the impurities, and a source area 91 and a drain area 92 are formed in the island-shaped semiconductor film 85. Then, as shown in FIG. 23E, an interlayer insulating film 89 is formed, contact holes are formed in the film 89, and a source electrode 93 and a drain electrode 94 electrically connected to the source area 91 and the drain area 92 which are coupled through a channel 90 defined therebetween are formed.

In the above-described processes, the channel 90 is formed in accordance with a position of a crystal having a large particle size, i.e., in a crystal grain of the polycrystal semiconductor film or the single-crystallized semiconductor film 84 generated in the processes shown in FIGS. 23A and 23B. With the above-described processes, it is possible to form a thin-film transistor (TFT) in the single-crystallized or polycrystal semiconductor. The thus manufactured polycrystal transistor or single-crystallized transistor can be applied to a drive circuit for a liquid crystal display unit (display) or an electroluminescent display or an integrated circuit for, e.g., a memory (an SRAM or a DRAM) or a CPU.

In the above description, the present invention is applied to the crystallization apparatus and the crystallization method which generate a crystallized semiconductor film by irradiating a non-crystallized semiconductor film with light beam having a predetermined light intensity. However, the present invention is not restricted thereto, and the present invention can be generally applied to a light irradiation or projecting apparatus which forms a predetermined light intensity distribution on a predetermined surface through an image formation optical system.

What is claimed is:
1. A light irradiation apparatus comprising:
  a light modulation element which has at least one unit phase modulation area having at least one basic pattern for modulating a light beam;
  an illumination system which illuminates the unit phase modulation area of the light modulation element with a light beam; and
  an image formation optical system which causes a light beam having on an irradiation target surface a light intensity distribution having an inverse-peak-shaped pattern formed based on the light beam phase-modulated by the phase modulation element to fall on an irradiation target object,
  wherein dimensions of the basic pattern of the unit phase modulation area are not greater than a point spread function range of the image formation optical system converted in terms of the light modulation element, and
  the unit phase modulation area is configured in such a manner that a phase distribution in a light complex amplitude distribution on the irradiation target surface becomes a saw-tooth-like distribution along a line segment in a lateral direction.

2. The light irradiation apparatus according to claim 1, wherein the unit phase modulation area is configured in such a manner that an amplitude distribution along the line segment in the light complex amplitude distribution becomes substantially constant except for an area corresponding to a step portion in the saw-tooth-like distribution of the phase distribution.

3. The light irradiation apparatus according to claim 1, wherein the unit phase modulation area is configured in such a manner that the amplitude distribution in the light complex amplitude distribution increases in accordance with a distance from the line segment.

4. The light irradiation apparatus according to any one of claims 1 to 3, wherein the unit phase modulation area comprises areas having at least three types of phase modulation values.

5. The light irradiation apparatus according to any one of claims 1 to 3, wherein the illumination system illuminates the unit light modulation element with an illumination light inclined along the inside of a surface including the line segment.

6. The light irradiation apparatus according to claim 5, wherein the illumination system illuminates the light modulation element along a direction corresponding to a direction including a component directed from a phase advance side to a phase delay side in a step portion of the saw-tooth-like distribution in the phase distribution.

7. A crystallization apparatus comprising: the light irradiation apparatus according to any one of claims 1 to 3; and a stage which holds a non-single-crystal semiconductor film on the irradiation target surface, wherein the crystallization apparatus forms a crystallized semiconductor film by irradiating at least a part of the non-single-crystal semiconductor film on the irradiation target surface with the light beam having the light intensity distribution.

8. A crystallization method which forms a crystallized semiconductor film by irradiating at least a part of a non-single-crystal semiconductor film on the irradiation target surface with a light beam having the light intensity distribution by using the light irradiation apparatus according to any one of claims 1 to 3.

9. A semiconductor device manufactured by using the crystallization apparatus according to claim 7.

10. A light modulation element having at least one phase modulation area,
wherein the phase modulation area is configured in such a manner that a phase distribution in a light complex amplitude distribution formed on a surface which is optically substantially conjugate with the light modulation light becomes a saw-tooth-like distribution along a line segment in a lateral direction.

11. The light modulation element according to claim 10, wherein the phase modulation area is configured in such a manner that an amplitude distribution along the line segment in the light complex amplitude distribution becomes substantially constant except for an area corresponding to a step portion of the saw-tooth-like distribution in the phase distribution.

12. The light modulation element according to claim 10 or 11, wherein the phase modulation area is configured in such a manner that an amplitude distribution along the line segment in the light complex amplitude distribution increases in accordance with a distance from the line segment.

13. The light modulation element according to any one of claims 10 to 11, wherein the phase modulation area comprises areas having at least three types of phase modulation values.

* * * * *